United States Patent
Aweya et al.

(10) Patent No.: US 9,065,627 B2
(45) Date of Patent: *Jun. 23, 2015

(54) DIFFERENTIAL TIMING TRANSFER OVER SYNCHRONOUS ETHERNET USING DIGITAL FREQUENCY GENERATORS AND CONTROL WORD SIGNALING

(71) Applicant: RPX Clearinghouse LLC, San Francisco, CA (US)

(72) Inventors: James Aweya, Kanata (CA); Michel Ouellette, Orleans (CA); Delfin Y. Montuno, Kanata (CA)

(73) Assignee: RPX Clearinghouse LLC, San Francisco, CA (US)

(*) Notice: Subject to any disclaimer, the term of this patent is extended or adjusted under 35 U.S.C. 154(b) by 45 days.

This patent is subject to a terminal disclaimer.

(21) Appl. No.: 13/873,623

(22) Filed: Apr. 30, 2013

(65) Prior Publication Data

US 2013/0235889 A1 Sep. 12, 2013

Related U.S. Application Data

(63) Continuation of application No. 12/268,008, filed on Nov. 10, 2008, now Pat. No. 8,467,418.

(51) Int. Cl.
| | |
|---|---|
| H04L 7/00 | (2006.01) |
| G06F 1/03 | (2006.01) |
| H03L 7/08 | (2006.01) |
| H03L 7/085 | (2006.01) |
| H03L 7/089 | (2006.01) |
| H04J 3/06 | (2006.01) |

(52) U.S. Cl.
CPC ............ *H04L 7/0079* (2013.01); *G06F 1/0328* (2013.01); *H03L 7/0805* (2013.01); *H03L 7/085* (2013.01); *H03L 7/089* (2013.01); *H03L 2207/50* (2013.01); *H04J 3/0632* (2013.01); *H04J 3/0658* (2013.01)

(58) Field of Classification Search
CPC ..................................................... H04L 7/0079
See application file for complete search history.

(56) References Cited

U.S. PATENT DOCUMENTS

| | | | |
|---|---|---|---|
| 5,970,107 A | 10/1999 | Bleiweiss et al. | |
| 6,829,717 B1 | 12/2004 | Roust | |
| 7,689,856 B2 | 3/2010 | Godiwala | |
| 8,467,418 B2 * | 6/2013 | Aweya et al. | 370/507 |
| 2006/0056560 A1 | 3/2006 | Aweya et al. | |
| 2008/0075220 A1 * | 3/2008 | Honken et al. | 375/376 |
| 2008/159270 A1 | 7/2008 | Burke et al. | |
| 2009/0276542 A1 | 11/2009 | Aweya et al. | |

* cited by examiner

*Primary Examiner* — Jason Mattis
(74) *Attorney, Agent, or Firm* — Christopher & Weisberg, P.A.

(57) ABSTRACT

Transfer of differential timing over a packet network is provided. A transmitting service interface receives a service clock and is coupled to a receiving service interface through a network backplane. A primary reference clock is provided to time the network backplane. The primary reference clock and the service clock are used to synthesize a copy of the service clock connected to the transmitting service interface. A first control word containing an error differential between the service clock and the synthesized copy of the service clock is generated and transmitted through the network backplane via a packet. The first control word, together with the primary reference clock, is used to recreate the service clock for timing the receiving service interface.

16 Claims, 19 Drawing Sheets

Maximum value of UP/DOWN Counter is *Max*

DIFFERENTIAL TIMING TRANSFER OVER SYNCHRONOUS ETHERNET USING DIGITAL FREQUENCY GENERATORS AND CONTROL WORD SIGNALING

CROSS-REFERENCE TO RELATED APPLICATION

This application is a continuation of U.S. patent application Ser. No. 12/268,008, filed Nov. 10, 2008, entitled DIFFERENTIAL TIMING TRANSFER OVER SYNCHRONOUS ETHERNET USING DIGITAL FREQUENCY GENERATORS AND CONTROL WORD SIGNALING, the contents of which are hereby incorporated herein by reference.

STATEMENT REGARDING FEDERALLY SPONSORED RESEARCH OR DEVELOPMENT n/a

FIELD OF THE INVENTION

The present invention relates generally to a method and system for differential timing transfer in communication networks and more specifically to a method and system for differential timing transfer over Synchronous Ethernet using digital frequency generators and control word signaling.

BACKGROUND OF THE INVENTION

Differential timing transfer is used when there is a network interface with its own source clock and there is the need to transfer this clock over a core packet network (with its own independent network-wide reference clock) to another interface. This transfer is performed while each interface and the core network maintain their timing traceability to their independent source clocks.

Differential clocking, such as the Synchronous Residual Time Stamp ("SRTS") method specified for Asynchronous Transfer Mode ("ATM") networks, allows equipment at the edges of a packet network to use a clocking signal that is different and completely independent from the clocking signal being used in the core packet network. The Residual Time Stamp ("RTS") measures the difference between the service clock received on a Time Division Multiplexing ("TDM") interface and the network-wide reference clock. Stringent protocol requirements of SRTS require that the RTS value be specified using four bits and must be sent per eight cells using one bit in the ATM Adaptation Layer 1 ("AAL1") header for every odd sequence numbered cell. The RTS is propagated to the remote end of the circuit in the AAL1 header of the ATM cell. The receiving end reconstructs the clock by adjusting the reference clock by the RTS value.

Adaptive clock recovery ("ACR") is another technique used to distribute and recover clock from a packet network. The task of clock recovery is an "averaging" process that mitigates the deleterious effects of network impairments, such as random packet delay variation ("PDV"), and captures the average rate of transmission of the original bit stream. In adaptive clock recovery, because there is no network-wide reference clock available, the performance of ACR techniques are subject to packet network impairments and cannot be guaranteed. For high performance, adaptive clock recovery requires that the slave implement very sophisticated phase locked loops and highly expensive oscillators.

Synchronous Ethernet network synchronization is a recently developed technology used to extend the well-known concepts of TDM network synchronization into the domain of packet-based networks, which until now have been specified as asynchronous in nature. The timing standard for Synchronous Ethernet implementations has been defined by the Telecommunication Standardization Sector of the International Telecommunication Union ("ITU-T"), in recommendation G.8261, entitled "Timing and Synchronization Aspects in Packet Networks." Synchronous Ethernet provides frequency distribution via the Ethernet physical layer. Synchronous Ethernet is essentially native Ethernet equipped with timing traceability at the physical layer.

For traditional Ethernet networks, the timing sources at each edge of the network cannot be synchronized to each other. Therefore, what is needed is a simple, accurate, and inexpensive system and method for providing differential timing transfer over Synchronous Ethernet networks.

SUMMARY OF THE INVENTION

The present invention advantageously provides a method, system and master service interface for transferring differential timing over a packet network. Generally, the master service interface creates a control signal that is used to synthesize a copy of a service clock connected to the master service interface, as well as to recover or recreate the service clock at a remote receiving, or "slave" service interface.

In accordance with one aspect of the present invention, a method is provided for transferring differential timing over a packet network. The packet network includes a service clock connected to a transmitting service interface, which in turn is coupled to a receiving service interface through a network backplane. A primary reference clock is provided to time the network backplane. The primary reference clock is used to synthesize a copy of the service clock connected to the transmitting service interface. A first control word is generated which contains an error differential between the service clock and the synthesized copy of the service clock. A packet containing the first control word is transmitted through the network backplane to the receiving service interface. The first control word is used to recreate the service clock for timing the receiving service interface.

In accordance with another aspect of the present invention, a system for transferring differential timing over a packet network includes a network backplane, a transmitting service interface, and a receiving service interface. The network backplane is timed by a primary reference clock and is communicatively coupled to the transmitting service interface and to the receiving service interface. Using the primary reference clock, the transmitting service interface operates to synthesize a copy of a service clock connected to the transmitting service interface. The transmitting service interface further operates to generate a first control word which contains an error differential between the service clock and the synthesized copy of the service clock, and to transmit a packet containing the first control word through the network backplane to the receiving service interface. The receiving service interface operates to receive the first control word and use the first control word to recreate the service clock for timing the receiving service interface.

In accordance with yet another aspect of the present invention, a master service interface for transferring differential timing over a packet network includes a master clock and a processor. The packet network is timed by a primary reference clock. The master clock operates to synthesize a copy of a service clock connected to the master service interface; and generate a control word containing an error differential between the service clock and the synthesized copy of the service clock. The processor is communicatively coupled to the master clock. The processor operates to transmit a packet containing the control word through the packet network.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION OF THE INVENTION

Figure 1:
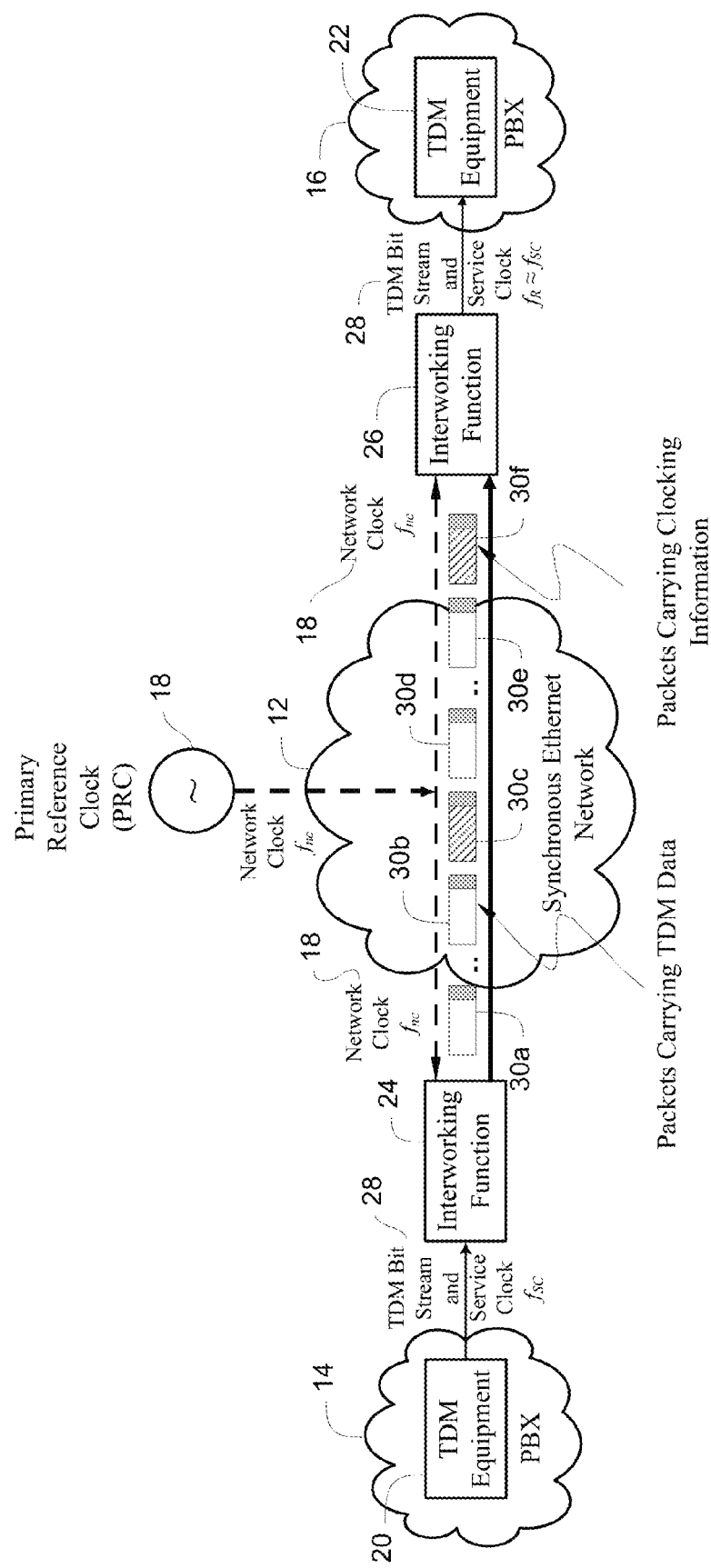
FIG. 1 is a block diagram of an exemplary packet data communication system using differential clocking, constructed in accordance with the principles of the present invention.

Before describing in detail exemplary embodiments that are in accordance with the present invention, it is noted that the embodiments reside primarily in combinations of apparatus components and processing steps related to implementing a system and method for providing differential timing transfer over a Synchronous Ethernet network. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

One embodiment of the present invention advantageously provides a method and system for providing differential timing transfer over a Synchronous Ethernet network using digital frequency generators and control word signaling. According to one embodiment, a transmitter implements a digital phase-locked loop ("DPLL") that consists of a phase-frequency detector ("PFD"), a loop filter and a digital frequency generator, e.g., a digital oscillator ("DO"). The transmitter periodically sends control words to the receiver so that the receiver may use these words to drive a local DO to reproduce the transmitter clock frequency.

Referring now to the drawing figures in which like reference designators refer to like elements, there is shown in FIG. 1 an exemplary system 10 for providing differential timing transfer across a packet network 12. The packet network 12 may be a Synchronous Ethernet network connecting two service interfaces 14, 16. The packet network 12 is synchronized to a primary reference clock 18, i.e., network clock $f_{nc}$. The service interfaces 14, 16 may be a private branch exchange ("PBX"), containing Time Division Multiplexing ("TDM") equipment 20, 22 that each receives its clocking from another reference source, e.g., a service clock $f_{sc}$. Previously, in order to connect a service interface 14, 16 to the packet network 12, the service clock had to be resynchronized with the network clock 18. To avoid resynchronizing the service clock to the network clock 18 in the course of TDM data transport through the packet network 12, differential clock recovery allows the receiving service interface 16, i.e., the "slave", to recover the service clock $f_{sc}$, from the transmitting interface 14, i.e., the "master", using the common network clock 18 of the packet network 12 available both at the transmitter 14 and receiver service interfaces 16.

A reference source timing signal is provided to the edge PBXs 14, 16 independently from the packet network 12. Interworking functions ("IWF") 24, 26 provide an interface between the packet network 12 and each PBX 14, 16. The IWFs 24, 26 are driven by the network clock 18. For PBX 14 to send TDM data to a user at PBX 16, the differential clocking works as follows. At PBX 14, TDM traffic is introduced into the packet network 12 according to the timing determined by the service clock signal $f_{sc}$. As IWF 24 segments the TDM bit stream 28 into packets 30*a*, 30*b*, 30*c*, 30*d*, 30*e*, 30*f* (hereinafter referenced collectively as packet 30), IWF 24 measures the difference between the service clock, which drives IWF 24 and the network clock 18. As IWF 24 generates packets 30, it incorporates this time difference or residual time stamp ("RTS") value into, for example, every eighth packet 30*c*, 30*f*. The packets 30 are propagated through the packet network 12 to IWF 26. As IWF 26 receives the packets 30, it not only assembles the packets 30 into the original TDM bit stream 28, but also reconstructs the user service clock timing signal from the RTS value carried within every eighth packet. IWF 26 reconstructs the clock by adjusting the network clock 18 by the RTS. Thus, using SRTS clocking, TDM traffic is synchronized between the ingress (segmentation) side of the circuit emulation and the egress (reassembly) side of the circuit according to service clock signal, while the packet network continues to function according to the network clock 18. Differential clocking method has better jitter and wander performance than adaptive clocking due to the use of common reference timing 18 available at both ends of the packet network 12.

Traditional Ethernet, as defined according to the Institute of Electrical and Electronics Engineers ("IEEE") standard 802.3, is asynchronous. Thus, data is only transmitted when there is information available to be transferred. The transmitted frames are preceded by a preamble designed to enable the receiver to lock onto the transmitting clock. Rather than maintaining global synchronization, each Ethernet receiver locks onto the transmitter's timing on a frame-by-frame basis; thus, there is no need to maintain network-wide synchronization. Highly accurate synchronization is not as crucial as it is in TDM networks because received frames are buffered, so that small timing discrepancies do not lead to bit slips.

In keeping with Ethernet Standards requirements, the physical layer transmitter clock is derived from an inexpensive +/−100 ppm oscillator and the receiver clock locks onto this clock. There is no need for long-term frequency stability as the data is packetized and can be buffered. For the same reason, there is no need for consistency between the frequencies of different links.

Figure 2:
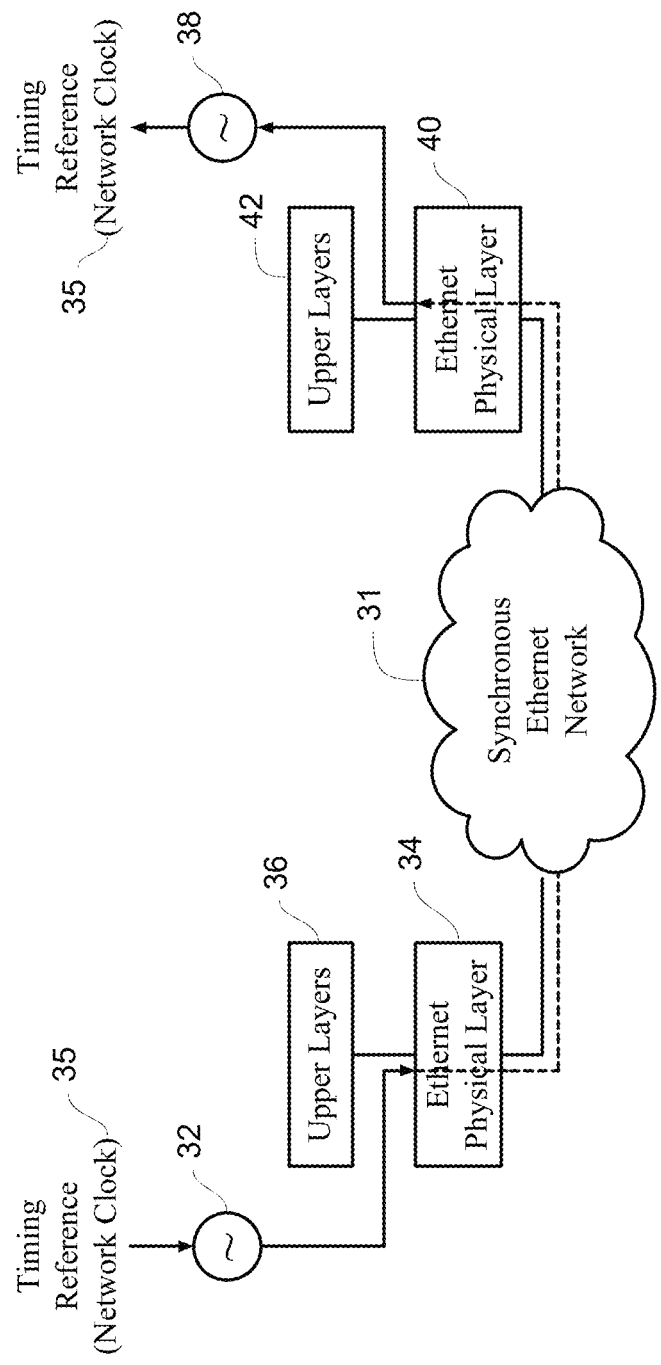
FIG. 2 is a block diagram of an exemplary Synchronous Ethernet system constructed in accordance with the principles of the present invention.

The physical layer is not synchronous from a network operations perspective. However, all the key elements exist within Ethernet to make it synchronous and allow master-slave synchronization at the physical layer and on a link-by-link basis. For example, as shown in FIG. 2 in relation to a Synchronous Ethernet network 31, the clock 32 for the physical layers 34 of the transmitter may be derived from a high quality frequency reference by replacing the local oscillator with a frequency source traceable to a primary reference clock ("PRC") 35. This enhancement does not affect the operation of any of the Ethernet upper layers 36 which are oblivious to the change. The receiver at the other end of the link automatically locks onto the clock 38 of the physical layer 40 of the received signal, and thus itself gains access to a highly accurate and stable frequency reference. Again, the operation of the Ethernet upper layers 42 of the received signal is not affected. Thus, Synchronous Ethernet may distribute timing via the Ethernet physical layer. This process enables recovery of the physical layer timing, which may be used directly by locking downstream networks and applications, or indirectly by using the physical layer timing as a common reference.

Thus, the Ethernet physical layer signal is capable of being derived from a primary reference clock as defined by the ITU-T G.811 standard. This clock can be extracted at the receiver, without requiring any changes to the IEEE 802.3 model. In other words, Synchronous Ethernet does not violate the IEEE 802.3 model. By feeding one network element in an Ethernet network with a PRC, and employing Ethernet Physical layer circuitry with high quality oscillators, a fully timing synchronized network may be established. Unlike TDM networks, this timing accuracy is not required for the proper functioning of the data plane, which could function perfectly well with relatively inaccurate and inconsistent physical layer clocks. Instead, access to highly accurate and stable frequency reference is provided to applications that require such references.

For example, cellular communication base-stations require a highly accurate frequency reference from which they derive transmission frequencies and operational timing. Additionally, acceptance of TDM pseudowires is facilitated by accurate clock recovery.

Synchronous Ethernet may be used to lock up the clocks of a network but there are times when an input source has its own independent clock (i.e., the service clock) and cannot be locked to the Synchronous Ethernet clock (i.e., the network clock). In this case, the backbone Synchronous Ethernet may be used for differential timing transfer. The advantage of using Synchronous Ethernet, as compared to sending timing information in packets over an unlocked physical layer, is that Synchronous Ethernet is not influenced by impairments introduced by the higher layers of the networking technology, e.g., packet loss, packet delay variation, out-order-arrival of packets. Hence, the frequency accuracy and stability may be expected to exceed those of networks with unsynchronized physical layers.

Figure 3:
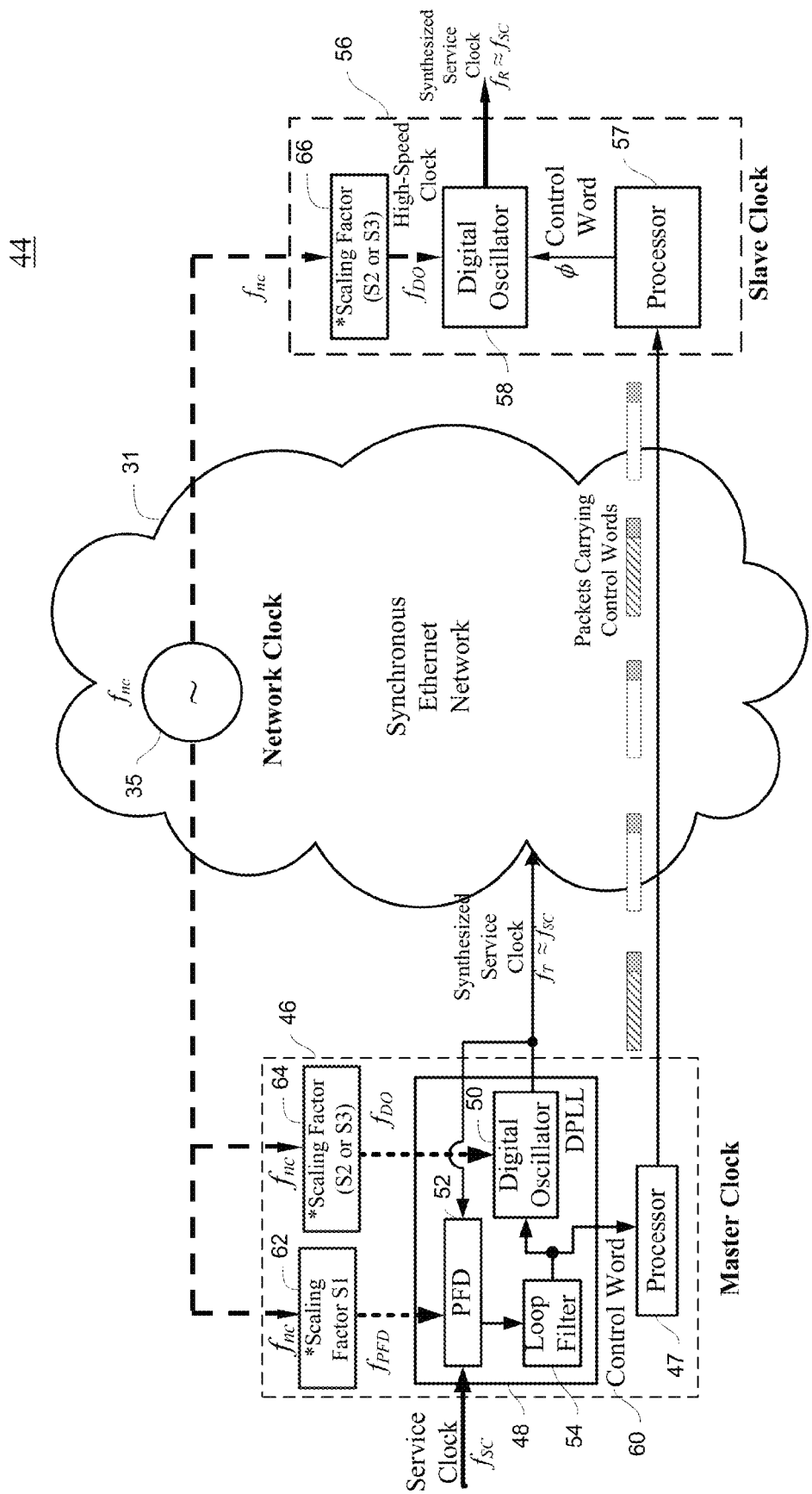
FIG. 3 is a block diagram of an exemplary differential clocking scheme constructed in accordance with the principles of the present invention.

Referring now to FIG. 3, an exemplary embodiment of a packet network 44 employing differential timing transference in accordance with the principles of the present invention is provided. The packet network 44 includes a transmitter and a receiver communicating through a network backplane 31 such as, for example, a Synchronous Ethernet network. The network backplane 31 is clocked by a primary reference clock, e.g., network clock 35. The network clock 35 frequency may be supplied from a global positioning system ("GPS") or Building Integrated Timing Supply ("BITS") and is assumed to drive both the master clock 46 and the slave clock 56.

The transmitter has a master clock 46 consisting of a processor 47 and a digital phase-locked loop ("DPLL") 48 with its own internal local digital oscillator ("DO") 50, phase-frequency detector ("PFD") 52 and loop filter 54. The digital oscillator 50 is an active electronic device that accepts an input reference frequency and then generates one or more new ones as commanded by a control word. In addition, the stability, accuracy, and spectral purity of the output correlate with the performance of the input reference. Frequencies are generated as digital representations of the desired signal by means of digital sampling techniques. The approach inherently affords great flexibility to the designer in terms of control and accuracy of the selected frequency. Since the DO chip contains the digital processing to construct and manipulate a frequency, most analog circuitry is eliminated, along with bothersome analog tolerances and aging effects.

The function of the DO 50 is similar to that of a voltage controlled oscillator ("VCO") in an analog phase locked loop ("PLL"). The VCO output frequency is a function of its input voltage, which is proportional to the phase error signal. In the digital PLL 48 with a DO 50, the time period of the DO 50 is controlled directly. The output of the loop filter 54, in the form of a correction (or control) word 60, is used to control the period of the DO 50 in such a way as to decrease the error signal generated by the phase detector. Two types of DOs, the divide-by-N counter type oscillator ("DNCO") and the direct digital synthesizer ("DDS") are described in greater detail below.

The receiver includes a slave clock 56 which has a processor 57 and a DO 58 and is located at another point in the packet network 44. DPLL error signals are generated by the PFD 52 of the master clock 46 and then processed by the loop filter 54 to form a DO control word 60. The DO control word 60 is used to control the local DO 50 in the master DPLL 48 and also the slave DO 58. The control signals for the slave DO 50 are communicated across the packet network 44 from the master. Logically, the clock synchronization scheme can be viewed as having a single DPLL controlling many DOs. The local DO 50 of the master 46 acts as surrogate DO for the slave DO 58 from the point of view of locking onto the reference frequency.

Communication between the DPLL 48 of the master clock 46 and the DO 58 of the slave clock 56 over the packet network 44 may be done in-band, i.e., clock state samples may be transmitted with or without user data, or out-of-band, i.e., using a separate physical or logical communication channel.

Since a network clock ($f_{nc}$) 35 is typically low-frequency and can be much lower than the PFD sampling frequency ($f_{PFD}$) and the DO high-speed internal clock ($f_{DO}$), the network clock 35 may be scaled to the appropriate frequency using scaling factor circuits 62, 64, 66.

Figure 4:
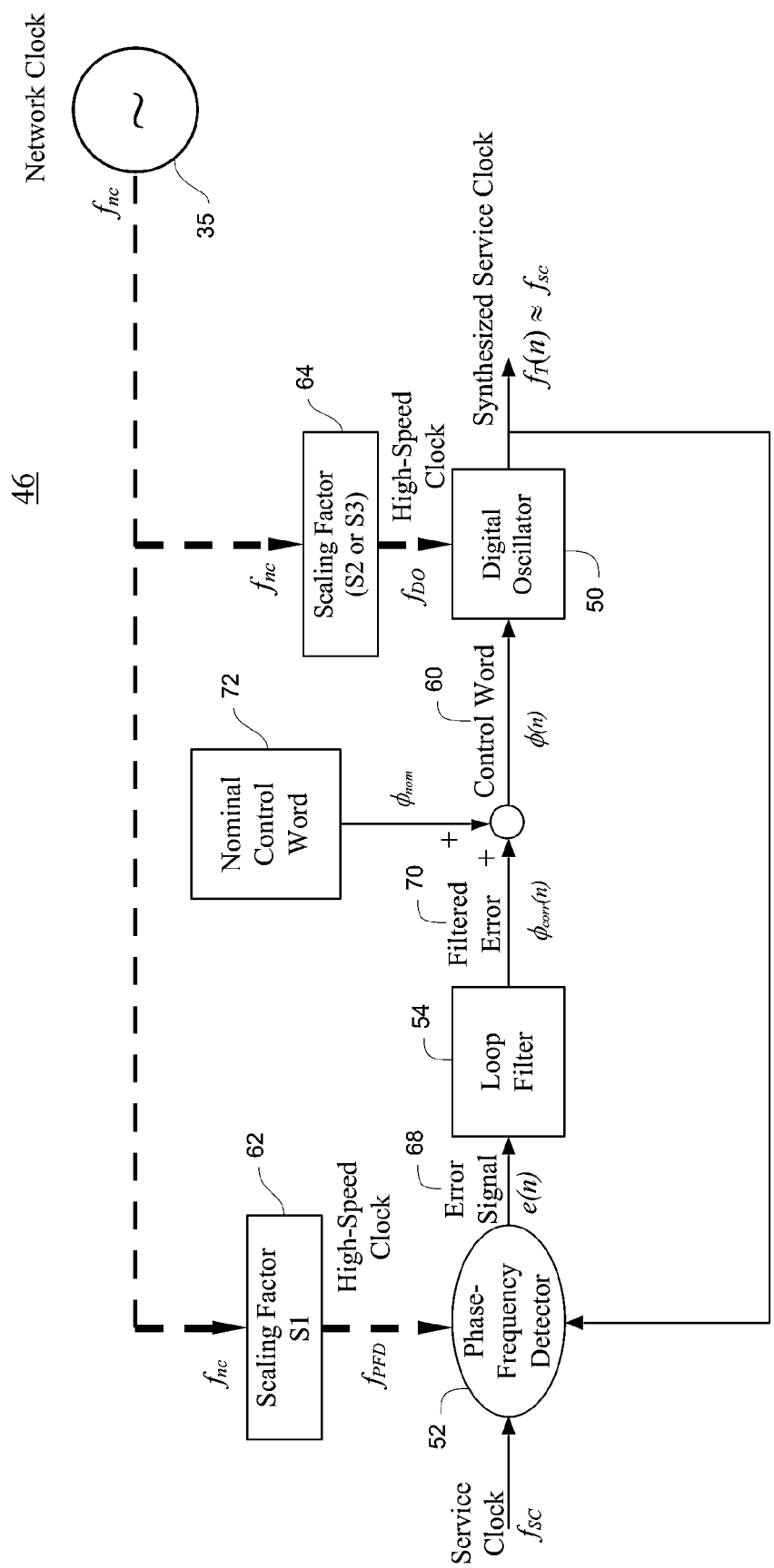
FIG. 4 is a block diagram of an exemplary master clock configured as a digital phase-locked loop constructed in accordance with the principles of the present invention.

An exemplary block diagram of the master clock 46 is provided in FIG. 4. The PFD 52 samples and compares the input reference signal $f_{sc}$ with the recovered (or synthesized) clock $f_T$ to produce digitized error samples 68 which are proportional to the phase and frequency differences between $f_{sc}$ and $f_T$. The error samples are filtered by a digital loop filter 54 and corresponding output samples 70 are used to control the period of the DO 50. The output of the loop filter 54 is used to correct the phase and frequency of the DO 50 by changing the next clock period in an appropriate direction. A properly designed loop filter 54 forces the reconstructed reference $f_T$ to accurately track the input reference signal $f_{sc}$.

As noted above, because a network clock 35 is typical low-frequency and can be much lower than the PFD sampling frequency and the DO high-speed internal clock, the network clock 35 is scaled to the appropriate frequency using the scaling factor circuits 62, 64.

The loop filter 54 output $\phi_{corr}$, or alternatively, the DO 50 input $\phi$, is sampled periodically, e.g., at 1 to 20 Hz, and transmitted to the slave clock 56 to allow the slave clock 56 to emulate the state of the master clock 46. It may be preferable to send $\phi_{corr}$ samples if a nominal control word $\phi_{nom}$ 72 is known at the slave clock 56. $\phi_{corr}$ may also allow a fewer number of bits for transmission. In the case where $\phi_{nom}$ is known at the slave clock 56 but is not the same as that of the master, then $\phi_{corr}$ is normalized accordingly.

Figure 5:
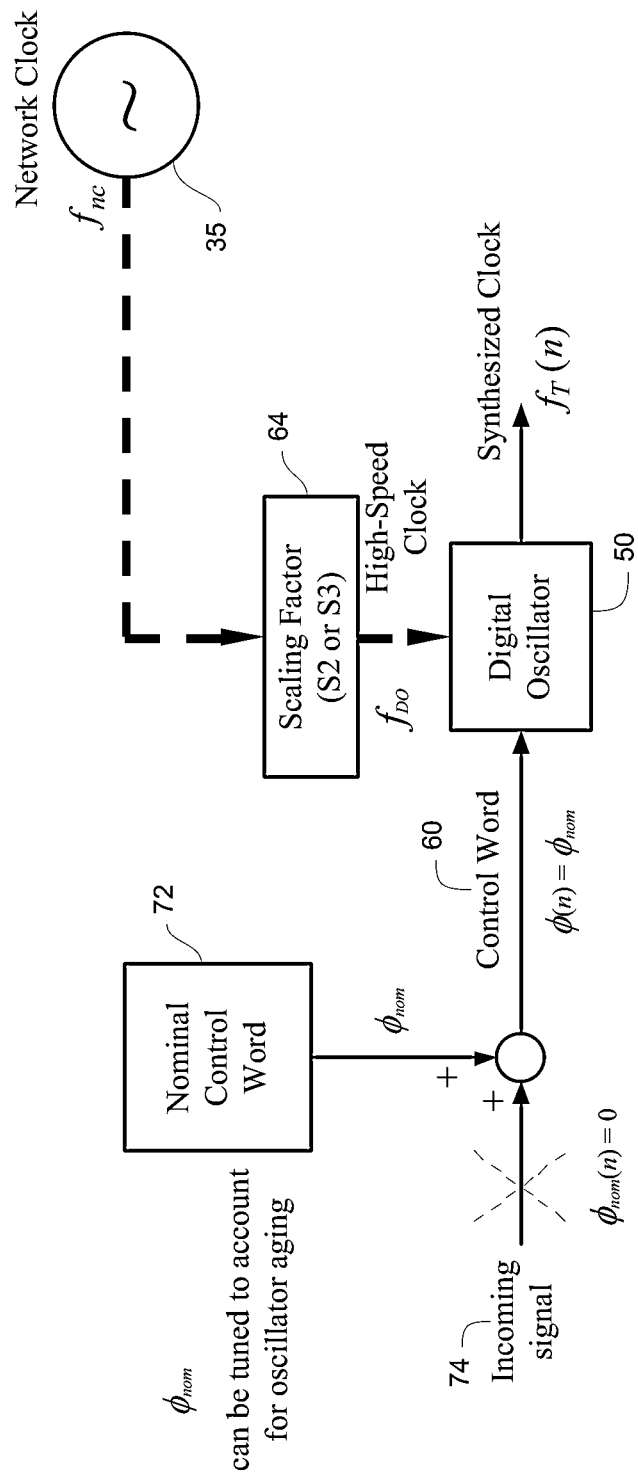
FIG. 5 is a block diagram of an exemplary master clock operating in a free-running mode constructed in accordance with the principles of the present invention.

FIG. 5 depicts the master clock 46 in a free-running mode. In this mode, the DO 50 is not synchronized with the incoming signal 74. The output of the loop filter 54 is disabled, e.g., set to zero, and the DO 50 is excited by a pre-determined control input. The free-running mode may be used in point-to-point or point-to-multipoint applications where frequency traceability to other frequency domains is not required.

If the master clock 46 is extracting clocking reference from a line that fails, the master can enter into a "holdover" mode. The "holdover stability" is the amount of frequency offset that a clock experiences after it has lost its synchronization reference.

Figure 6:
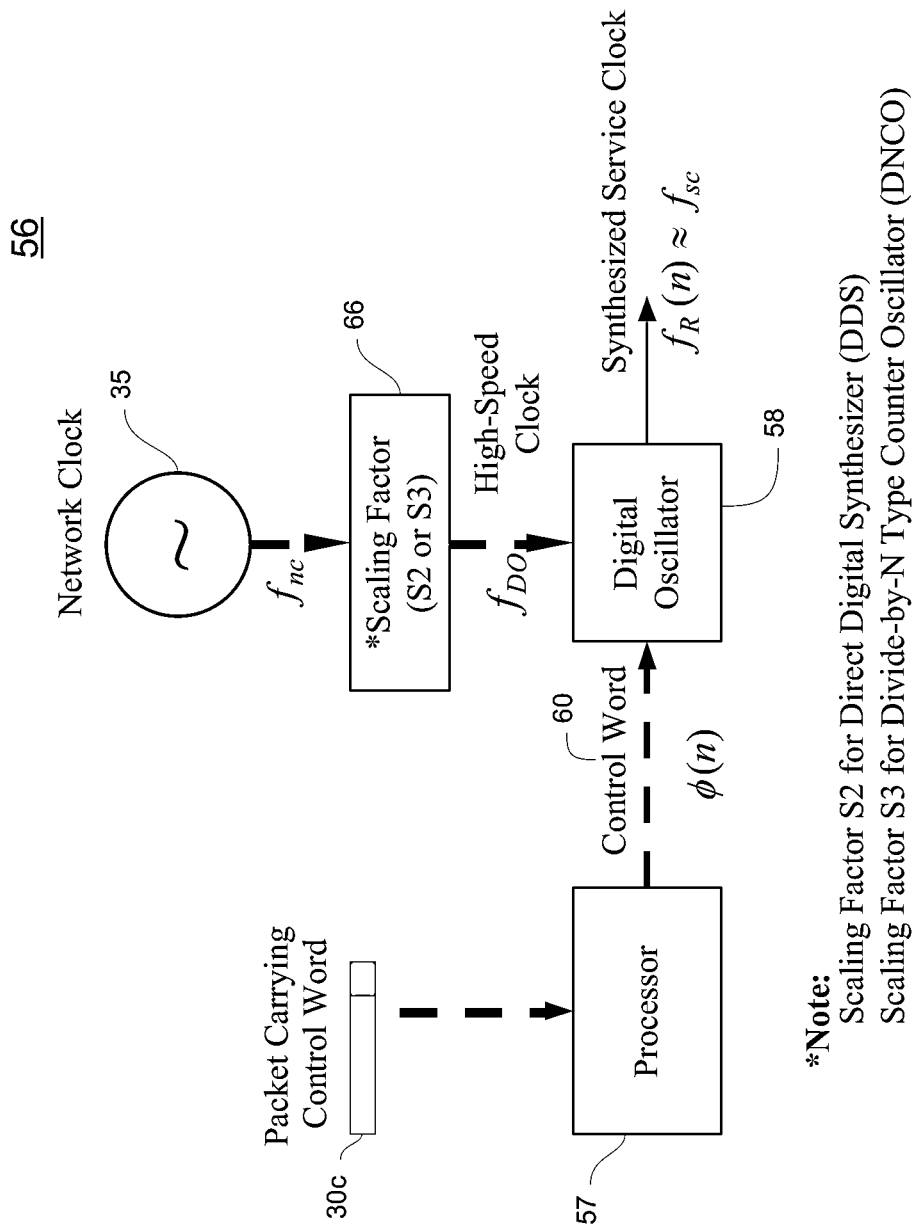
FIG. 6 is a block diagram of an exemplary slave clock constructed in accordance with the principles of the present invention.
Figure 7:
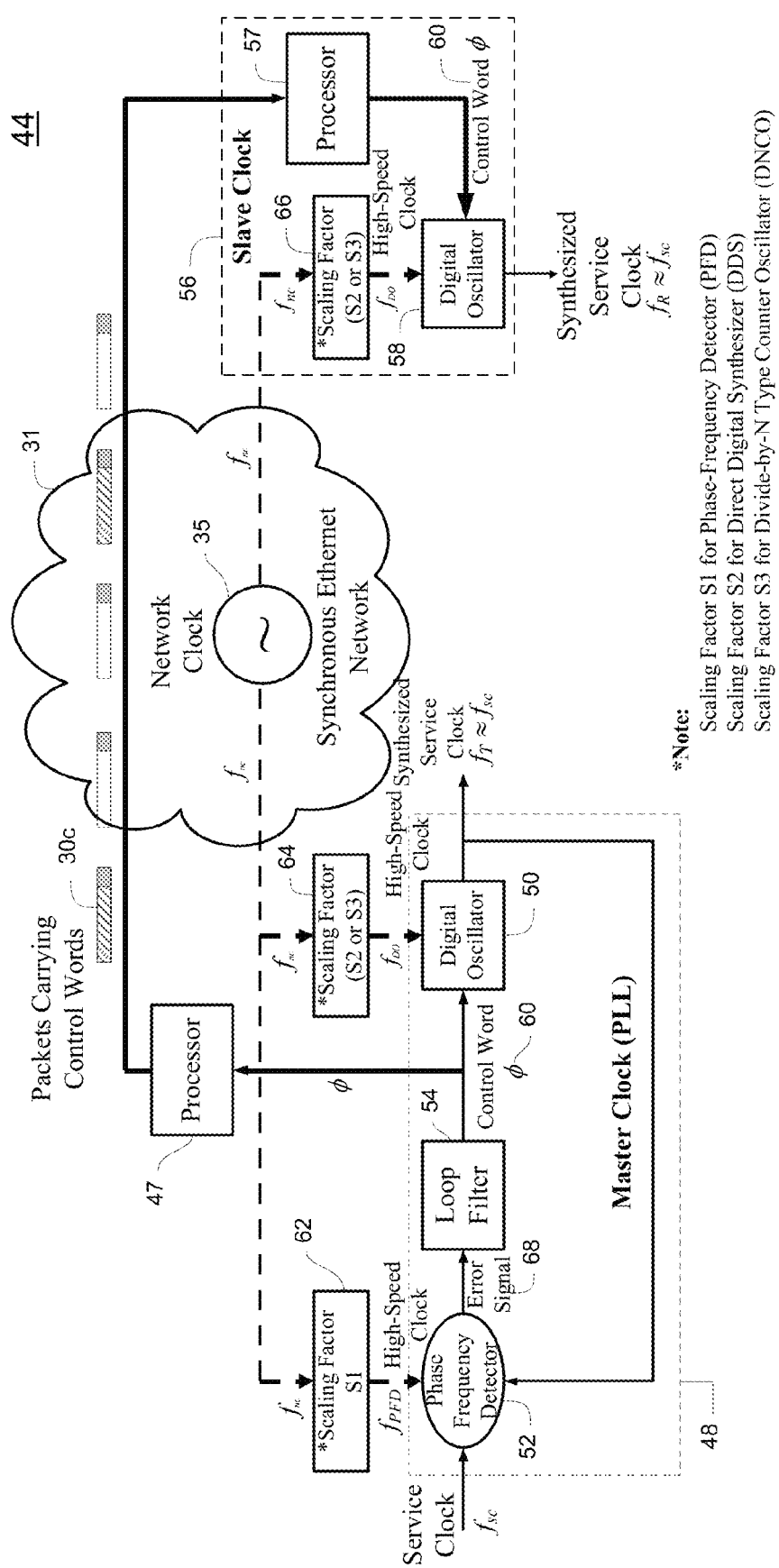
FIG. 7 is a flow diagram illustrating communicating control words from master to slave clock constructed in accordance with the principles of the present invention.

Referring to FIG. 6, an exemplary slave clock 56, constructed in accordance with the principles of the present invention is shown. The time period of the DO 58 is controlled directly using the DO control word 60 sent by the master 46. A full block diagram of the packet network 44 employing differential timing transference, including details of the master clock 46 and the slave clock 56, is depicted in FIG. 7. Assuming, for example, that clock state samples, $\phi_{corr}$ or $\phi$, are sent at a rate of 1 to 20 Hz. These samples are used to control the period of the DO 58 in such a way as to recover the service clock $f_{sc}$. As noted earlier, the slave DO 58 is only a remote arm of the master clock 46, bridged by the packet backplane 31 and is excited with the same sequence of control word 60 samples used at the master 46. If the master clock DO 50 and slave clock DO 56 are assumed to be identical, then these two clocks use the scaling factors for their respective DOs.

Figure 8:
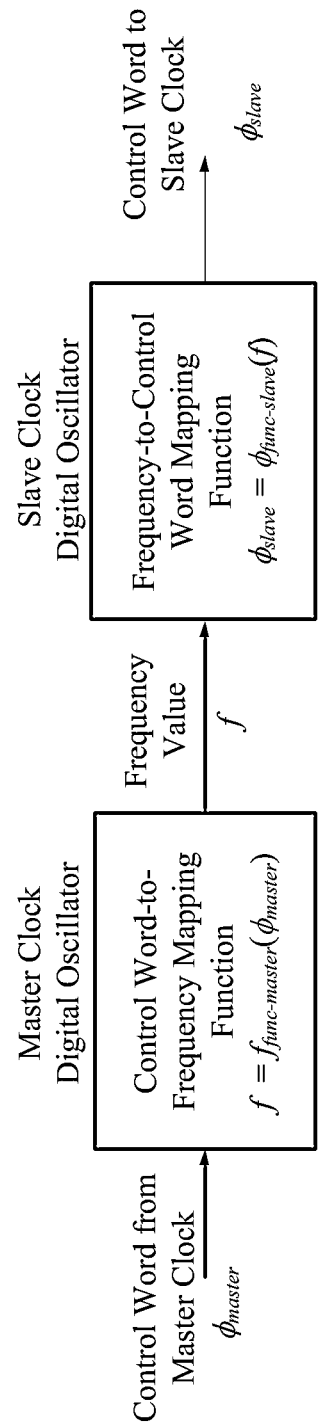
FIG. 8 is a flow diagram illustrating a process for mapping a master control word to a slave control word when the master and slave digital oscillators are dissimilar, constructed in accordance with the principles of the present invention.

Although the above example assumes that the differential timing technique requires that the transmitter and receiver have similar digital oscillators (DO), the scheme may still be applied when dissimilar DO are used at the master and slave clocks. DOs are numerically controlled oscillators which are typically well-characterized by mathematical mapping functions or lookup tables relating input control word and output frequency. With this attribute, the case of dissimilar DOs may be handled by simply mapping the derived master DO control word into the appropriate slave DO control word before applying this control word at the slave as illustrated in FIG. 8.

The idea of using a common network clock, transmitting the same control word used at the master to the slave, and also the low sampling frequency, makes the differential clocking scheme to be virtually free from the effects of control packet loss and delay variations. It is also important to note that at such low sampling rates, the quality of the master clock would not be expected to have degraded between sampling instances since oscillators used in TDM networks are expected to have well defined frequency stability characteristics, i.e., variation in frequency per second. For example, the short term drift of a Stratum 3 Clock system in holdover mode is less than $3.7 \times 10^{-7}$ in 24 hours. This is equivalent to 0.37 ppm/day, or 0.57128 Hz/day. The drift of a Stratum 3E Clock system with no input reference is less than $1 \times 10^{-8}$ in 24 hours. The synchronized clock for one embodiment of the present invention may have a basic sampling interval of 0.4 s, enabling 32 phase detector samples to be accumulated for down-sampling and sent to the system processor 47 for loop filter processing every 12.8 s. For the same reasons, loss of a control sample in the packet network would not cause clock degradation at the slave. From the above observations, the proposed clock synchronization scheme is expected to have strong jitter suppression characteristics.

Figure 9:
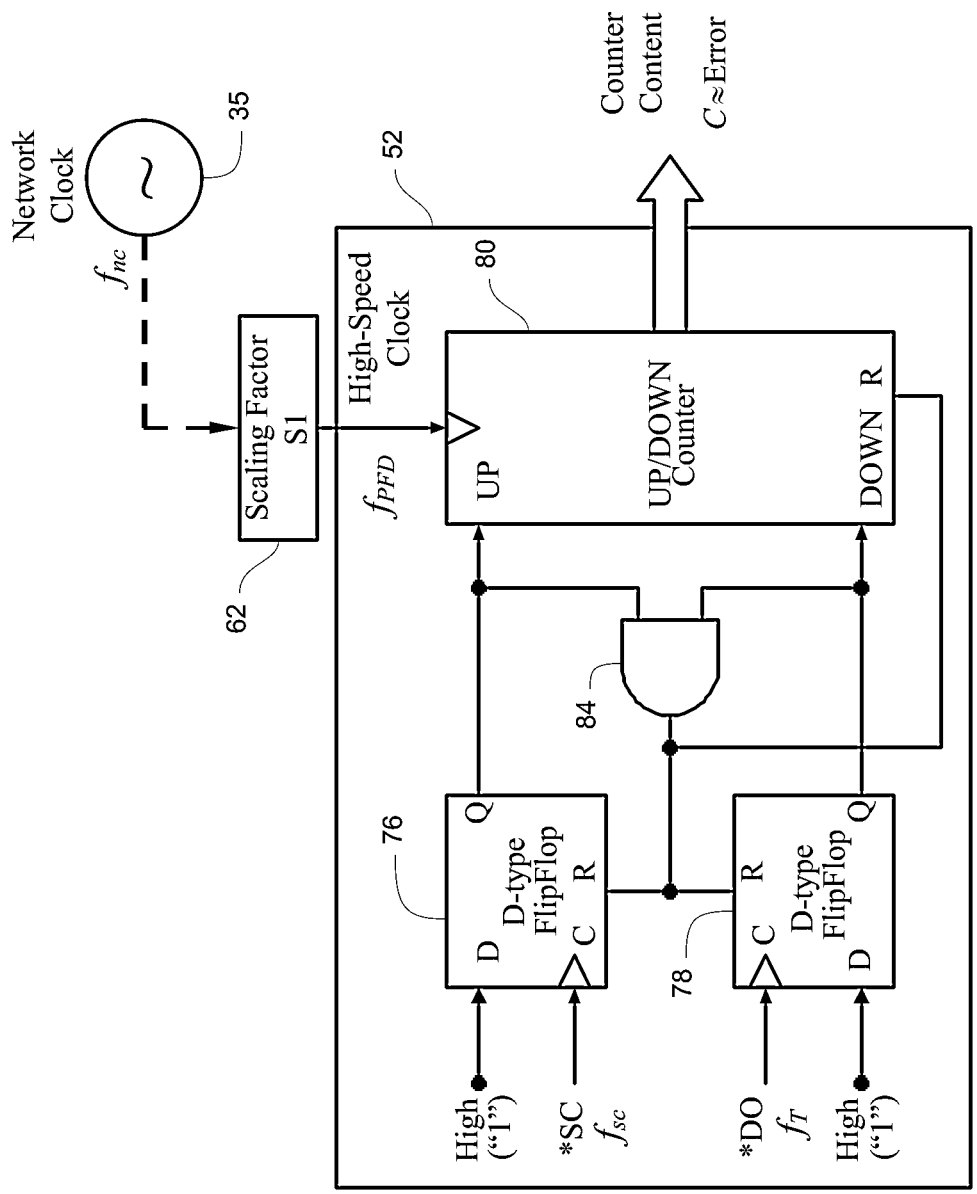
FIG. 9 is a block diagram of an exemplary phase-frequency detector constructed in accordance with the principles of the present invention.

Digital PFDs are commonly used to improve the pull-in range and pull-in time of phase-locked loop ("PLL") circuits and are especially suited to frequency-synthesis applications with periodic inputs. The digital PFD circuit 52 can be implemented, for example, using D-type master-slave flip-flops or R-S latches. FIG. 9 shows a PFD 52 built with two D-type flip-flops 76, 78, an UP/DOWN counter 80 and an AND gate 84. The inputs UP and DOWN of the counter 80 respond only to the positive-going edges of the inputs SC and DO. Therefore, the input duty cycles do not have any effects on the outputs.

The basic architecture shown has a number of drawbacks, and as such, several variations of this basic architecture exist in practice. For example, the non-ideal behavior of the digital circuitry due to gate delays alters the PFD 52 phase- and frequency-discriminator characteristics significantly, thus limiting the maximum frequency of operation. Thus, this circuit is used to illustrate the ideal operating principles of the PFD 52.

Figure 10:
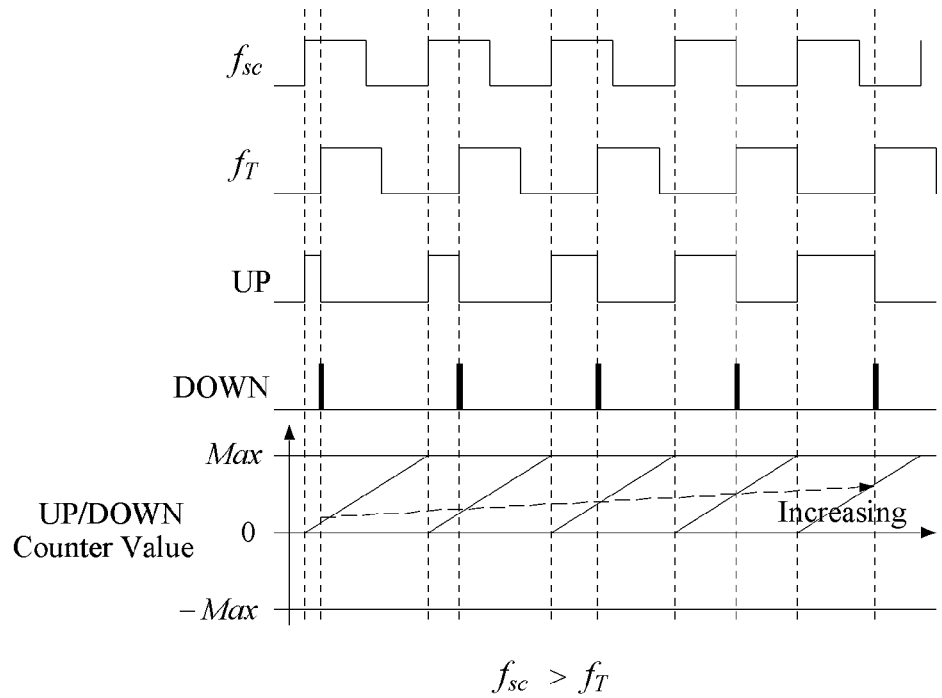
FIG. 10 is a timing diagram illustrating the operation of an exemplary phase-frequency detector when the service clock leads the digital oscillator output according to the principles of the present invention.
Figure 11:
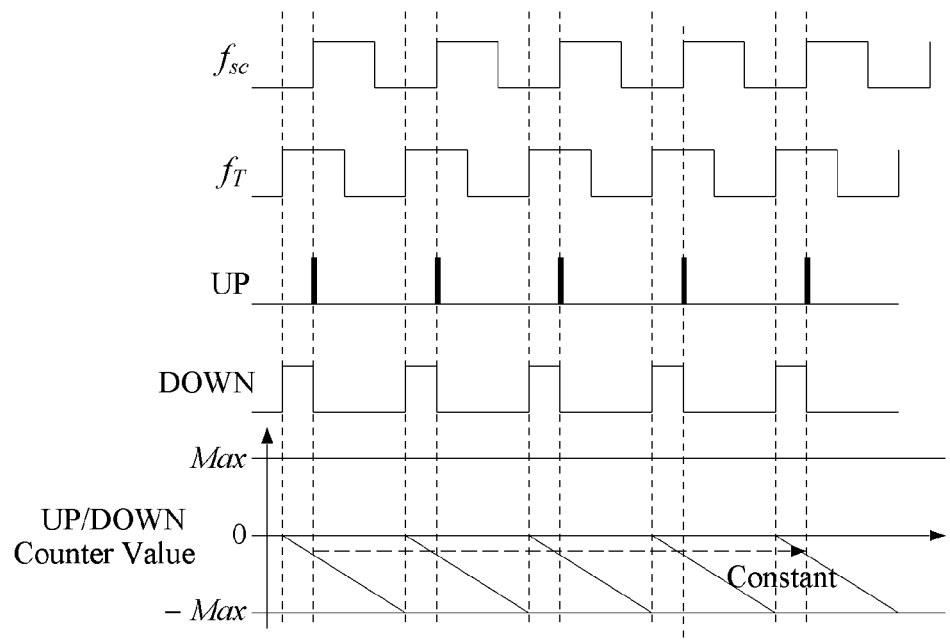
FIG. 11 is a timing diagram illustrating the operation of an exemplary phase-frequency detector when the service clock lags the digital oscillator output according to the principles of the present invention.
Figure 12:
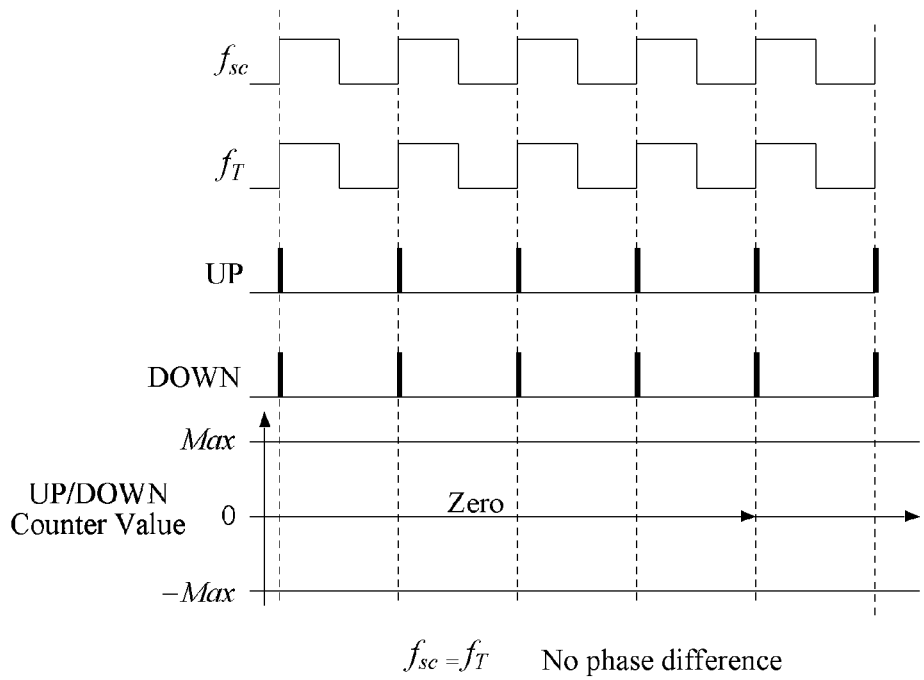
FIG. 12 is a timing diagram illustrating the operation of an exemplary phase-frequency detector when the service clock is in phase with the digital oscillator output according to the principles of the present invention.

The operations of a typical PFD are illustrated in FIG. 10, FIG. 11, and FIG. 12. The frequency of the high-speed oscillator driving the UP/DOWN counter 80 is usually $f_{PFD}=M \cdot f_{nom}$, where $f_{nom}$ is the nominal frequency of the service clock and M=Max is a large positive integer. If the service clock frequency $f_{sc}$ is greater than that of the DO output $f_T$, then the PFD 52 produces increasingly more positive pulses at output UP, while output DOWN remains at zero.

In FIG. 10, SC leads DO, hence the PFD 52 toggles between the states {UP=0, DOWN=0} and {UP=1, DOWN=0}. The time average value of the differential output, (UP−DOWN)$_{AVE}$, measured by the high-speed counter is an indication of phase difference between the clock reference SC and DO output. The UP/DOWN counter 80 output also increases with time since $f_{sc}>f_T$. Thus, the counter output varies monotonically with frequency error $\Delta f=f_{sc}-f_T$, when the DPLL 48 is out of lock. Conversely, if $f_{sc}<f_T$, then increasingly more negative pulses appear at output DOWN, while UP is zero. In this case the PFD 52 toggles between the states {UP=0, DOWN=0} and {UP=0, DOWN=1}.

If but there is a phase difference between SC and DO, as indicated in FIG. 11, the circuit generates pulses at either UP or DOWN with a width equal to the phase difference between the two inputs. When the two frequencies are equal, one of the outputs has a duty cycle that is a function of the difference between the input transition times while the other output remains inactive or low. Note that, in principle, UP and DOWN are never high simultaneously. Thus, the time average value of the differential output, (UP−DOWN)$_{AVE}$, measured by the high-speed counter, is an indication of phase difference between the clock reference SC and DO output. Since SC lags DO in FIG. 11, the PFD 52 toggles between the states {UP=0, DOWN=0} and {UP=0, DOWN=1}. The UP/DOWN counter also outputs a constant nonzero value with time.

Turning now to FIG. 12, assuming that the PFD 52 is in the {UP=0 and DOWN=0} state initially, if $f_{sc}=f_T$ and there is zero phase error between SC and DO, the SC and DO are exactly in phase, i.e., both positive edges of SC and DO occur at the same time, hence their effects cancel. The PFD 52 stays in the state {UP=0 and DOWN=0} forever. The UP/DOWN counter 80 outputs a constant stream of zeros.

Assume, for example, that the service clock period is quantized by the high-speed clock with frequency $f_{PFD}=1/\tau_{PFD}$ into M=Max steps, i.e., Max=$\tau_{nom}/\tau_{PFD}$. Note that the high-speed clock driving the PFD 52 may be different from that driving the DO 50. If the two clocks are equal, i.e., $f_{PFD}=f_{DO}$, then Max=$N_{nom}$. The UP-DOWN counter 80 is a binary counter of certain size whose upper limit can be denoted as Max. The counter 80 operates at the speed or some multiple of the high-speed DO. The counter 80 counts up or down, initially from zero, at every high-speed clock tick until it reaches Max−1, and then it will roll over and start again. The value stored in the counter 80 is latched out by the active rising edge of the service clock SC. Therefore, when the DO is frequency locked to the service clock, the counter value should be a fixed number (see FIG. 11). The counter 80 should output the same value at each active edge of SC after the DPLL 48 is locked.

Figure 13:
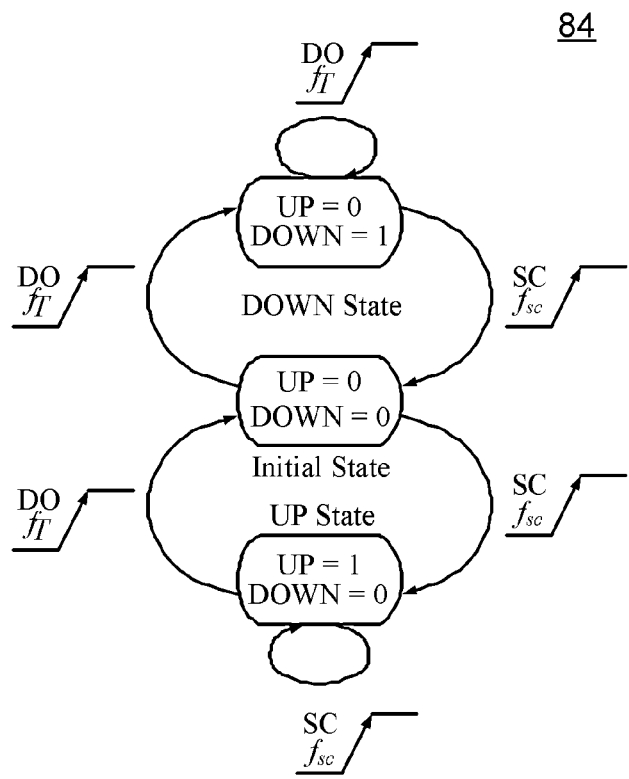
FIG. 13 is a state diagram for an exemplary phase-frequency detector according to the principles of the present invention.

FIG. 13 illustrates a state diagram 84 for the PFD 52. The PFD 52 can be in one of three states:
1. {UP=0, DOWN=0};
2. {UP=1, DOWN=0}; and
3. {UP=0, DOWN=1}.

However, there is a fourth state {UP=1, DOWN=1} that is inhibited by the addition of the AND gate 82. Thus, whenever both flip-flops 76, 78 are in the 1 (high) state, a logic "high" level appears at their R ("reset") inputs which resets both flip-flops 76, 78. Consequently the PFD 52 acts as a tri-state comparator ("triflop").

The D-type flip-flops 76, 78 are triggered by the positive-going edges of inputs, SC and DO, to the PFD 52. Initially, both outputs are low. When one of the PFD inputs rises, the corresponding output becomes high. The state of the finite-state machine ("FSM") 84 moves from an initial state to an UP or DOWN state. The state is held until the second input goes high, which in turn resets the circuit and returns the FSM to the initial state.

Figure 14:
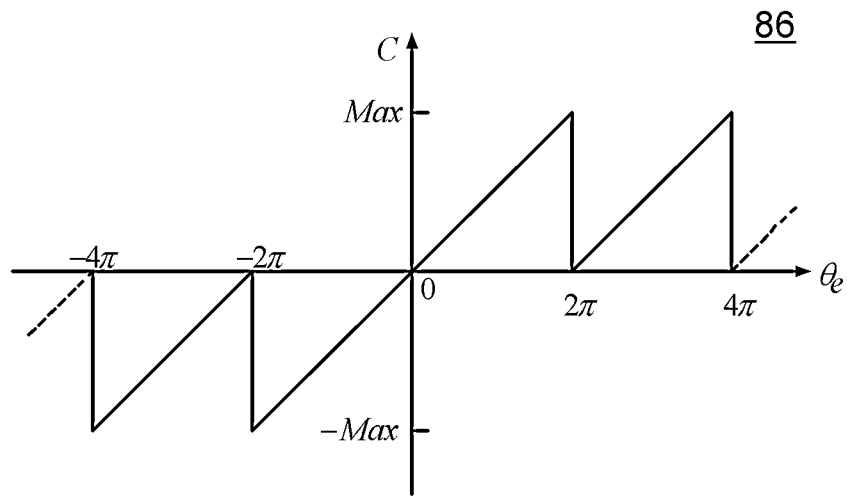
FIG. 14 is a graph illustrating the characteristics of an exemplary phase-frequency detector as a function of counter output, C, versus phase error, $\theta_e$, in accordance with the principles of the present invention.

It is important to note two observations from the waveforms shown in FIGS. 10-12. First, the UP/DOWN counter 80 attains its largest value when the phase error is positive and approaches 2π. Second, the UP/DOWN counter 80 attains its smallest value when the phase error is negative and approaches −2π. Thus, if the counter output C is plotted against the phase error $\theta_e$, the resulting sawtooth function is shown in FIG. 14. This represents the characteristics curve 86 of the PFD 52 and covers phase errors greater than 2π or smaller than −2π. The curve is periodic with period 2π. The PFD output is ideally linear for the entire range of input phase differences from −2π to 2π radians and has maximum output at Max.

The slope of the PFD characteristic curve 86 is equivalent to the gain of the PFD 52. From FIG. 14, the slope is given by $$K_{PFD} = \frac{\text{Max}}{2\pi}. \tag{1}$$

When the phase error is restricted to the range $-2\pi<\theta_e<2\pi$, the counter output becomes $$C(\theta_e) = \frac{\text{Max}}{2\pi}\theta_e = K_{PFD}\theta_e. \tag{2}$$

Referring back to FIG. 10, for instance, the SC is running faster than the DO. Thus, the time interval between the SC rising edge and the DO rising edge keeps increases as time progresses. When the PFD counter 80 value reaches its maximum Max, assuming positive slope, or minimum −Max, assuming a negative slope, it starts back at 0, i.e., resets and increases or decreases. Depending on the phase/frequency difference between SC and DO, the slope may be positive or negative and the slope basically stays the same until the next reset.

Figure 15:
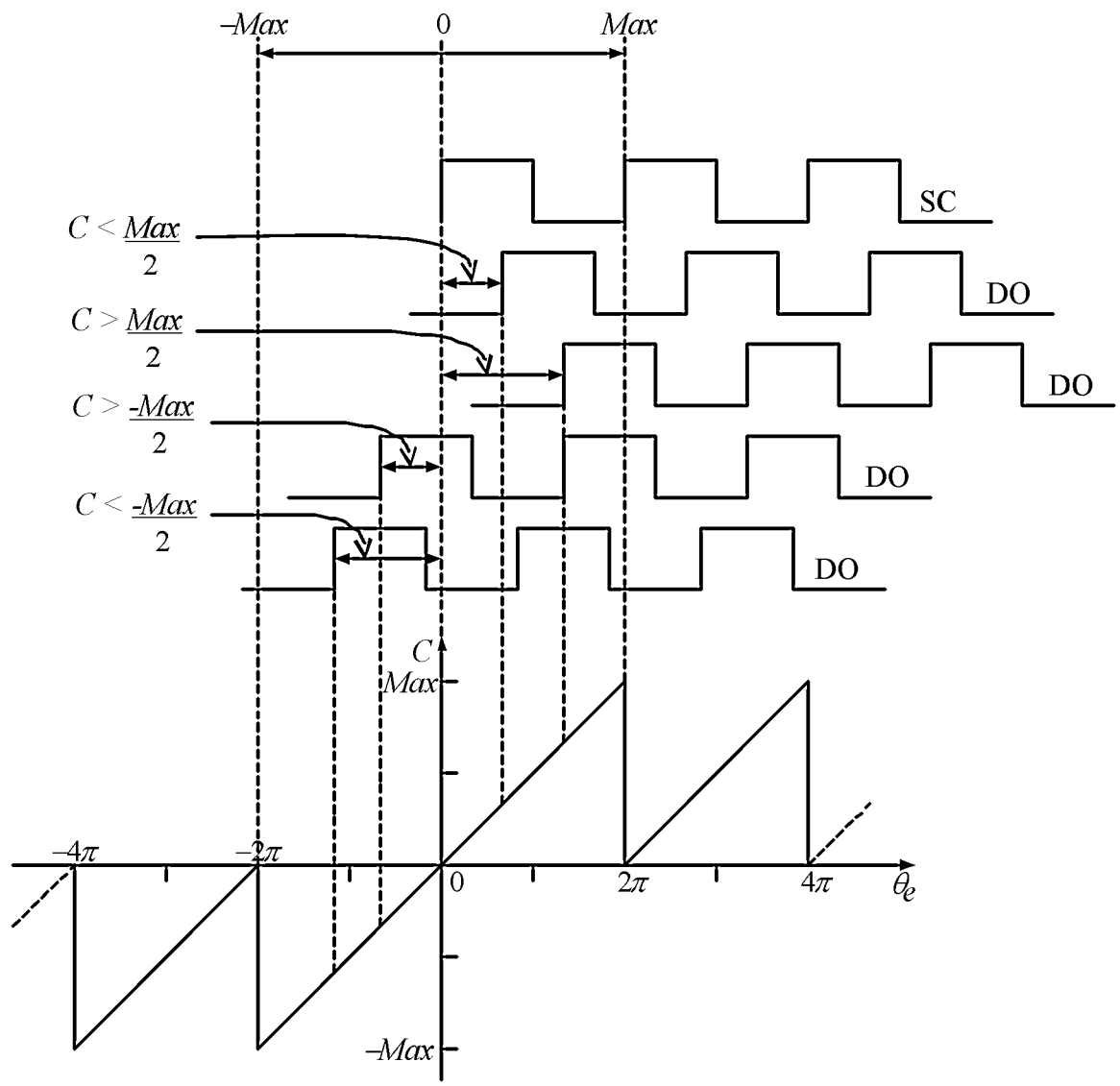
FIG. 15 is a timing diagram illustrating error patterns of a phase-frequency detector constructed in accordance with the principles of the present invention.

To interface with the loop filter 54, the PFD 52 may be implemented as shown in FIG. 15. At each rising edge of SC, the PFD counter value C(n) is latched out. This value is converted to a phase error according to the following expression:

If $C(n) > \frac{Max}{2}$ then $e(n) = C(n) - Max$ else $e(n) = C(n)$.

If $C(n) < -\frac{Max}{2}$ then $e(n) = C(n) - Max$ else $e(n) = C(n)$.

e(n) is then passed to the loop filter 54 for processing.

Figure 16:
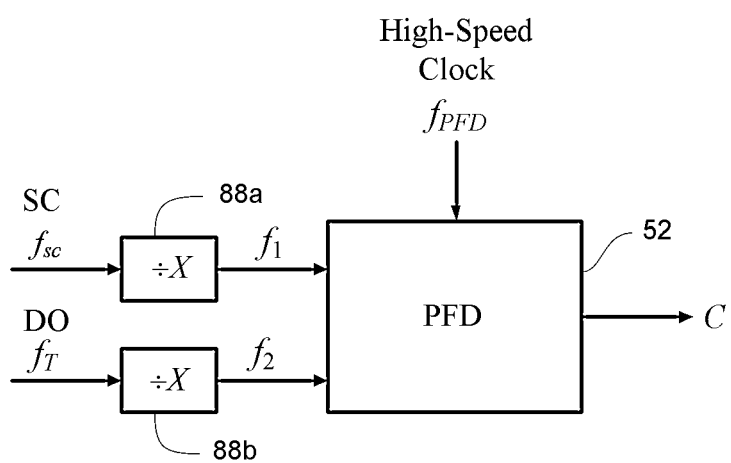
FIG. 16 is a flow diagram illustrating dividing the service clock and the digital oscillator output down to lower frame rates in accordance with the principles of the present invention.

In one embodiment, as shown in FIG. 16, to allow for the loop filter 54 to be implemented in software on a processor, the inputs SC and DO may be divided down to 8 KHz (or even 4 or 2 KHz) frame rates and fed to the PFD 52. Divide-by-X counters 88a, 88b are used in this case on the SC and DO clocks. For example, for T1 service clock, X may be 193, i.e., equal to a T1 frame length, or multiple thereof. In which case, the input frequencies to the PFD 52 are $f_1 = f_{sc}/X$ and $f_2 = f_T/X$ instead of frequencies $f_{sc}$ and $f_T$. Denoting the scaled-down nominal frequency as $f_{temp} = f_{nom}/X$, the maximum phase error is Max=$f_{PFD}/f_{temp}$.

Figure 17:
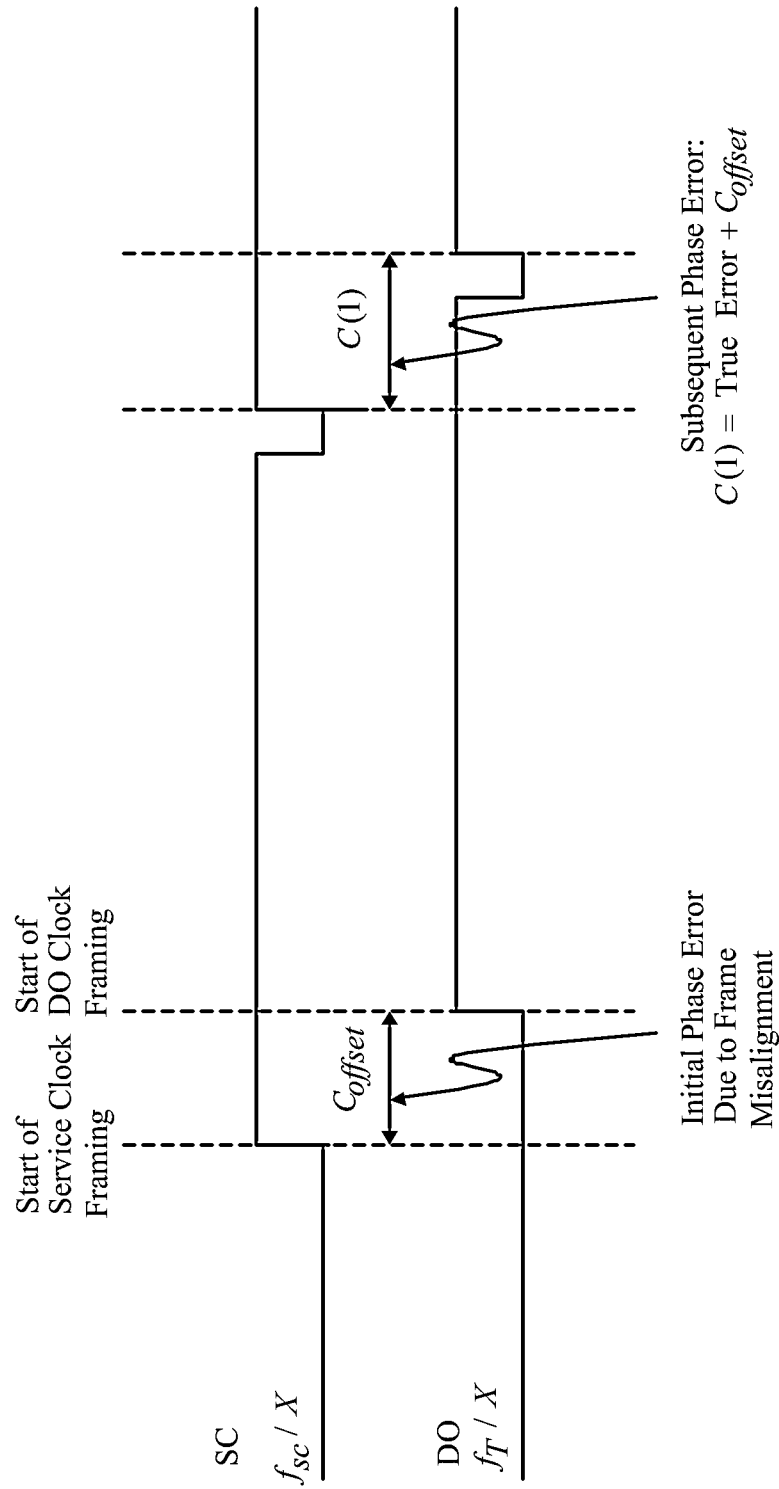
FIG. 17 is a timing diagram illustrating initial misalignment phase error at a phase-frequency detector in accordance with the principles of the present invention.

The input SC and DO frames are not necessarily aligned initially before entering the PFD 52. This initial misalignment would produce a static phase error $C_s$ at the PFD output which could be confused with a genuine phase error due to a true phase offset $C_{offset}$ between SC and DO, as shown in FIG. 17. Additionally, with $C_{offset}$ present, when the DO is frequency locked to the reference frequency, there is a constant phase error between them which can range between 0 and Max. This static error has to be determined and accounted for in all PFD outputs. To remove this initial static phase error which is due to the initial misalignment between the SC and DO frames, $C_{offset}$ is determined at system startup or reset time, and subtracted from all PFD outputs including the initial PFD output, which is $C_{offset}$. An alternative solution is to align SC and DO at the frame level before entering the PFD 52.

Figure 18:
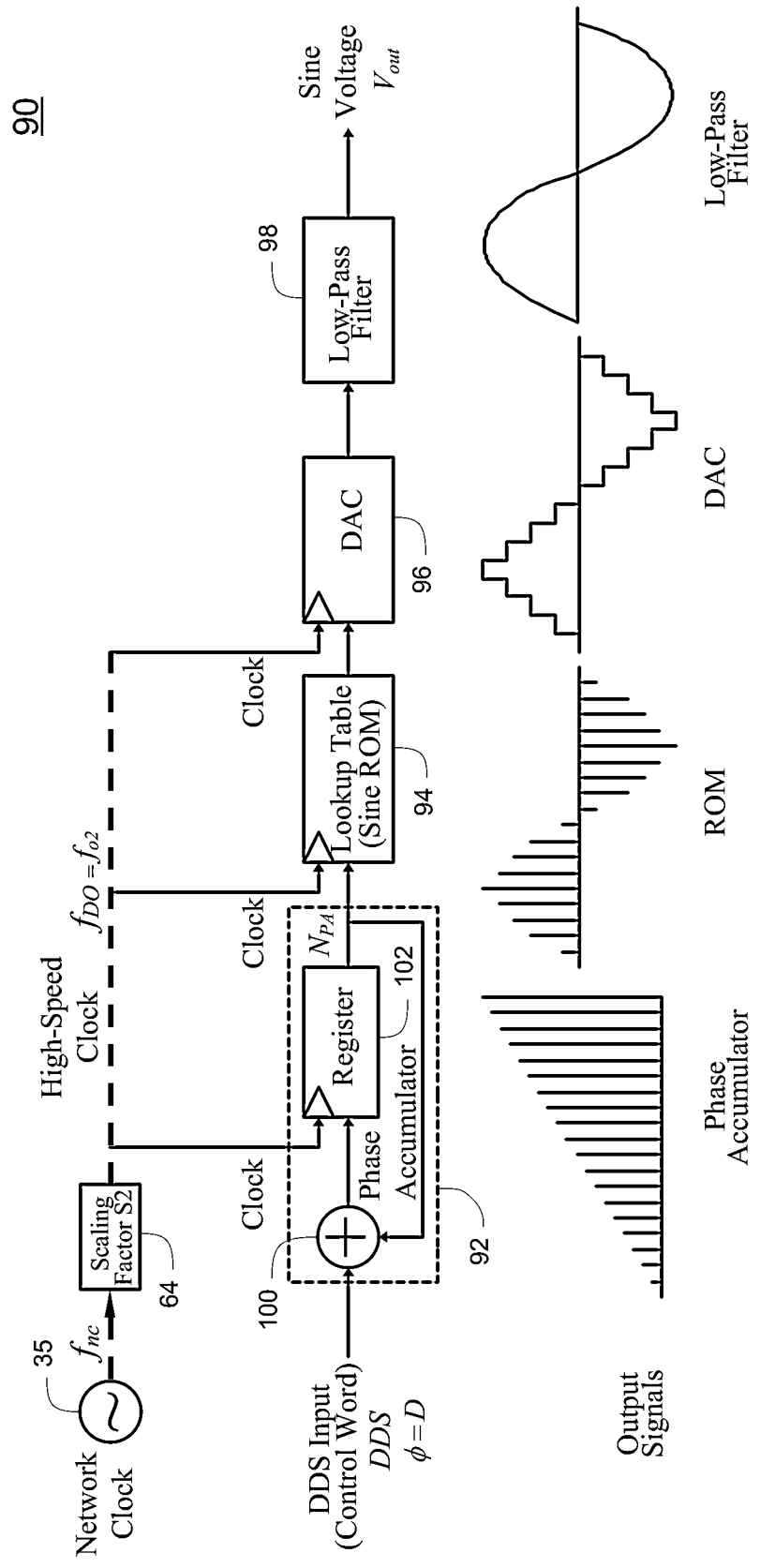
FIG. 18 a block diagram of an exemplary Direct Digital Synthesizer ("DDS") constructed in accordance with the principles of the present invention.

Referring now to FIG. 18, a block diagram is provided which illustrates an exemplary embodiment of the master DO 50, implemented in the form of a direct digital synthesizer 90 ("DDS"). The DDS 90 seems architecturally simple, yet provides persuasive advantages that are difficult or expensive to achieve with alternative synthesis methods. These advantages include very fast switching, fine steps, excellent phase noise, transient-free (phase continuous) frequency changes, frequency agility and extraordinary flexibility as a modulator, small size, among others.

Though there are many variations, the DDS 90 architecture may be viewed as an assembly comprised of only three common digital components: a phase accumulator 92 (or adder/accumulator), a mapping device such as a read-only-memory ("ROM") 94 or random-access memory ("RAM") (not shown), and a digital-to-analog converter ("DAC") 96. In many cases a low-pass filter 98 is implemented at the output of the DAC 96 but this component is not normally considered a part of the DDS 90. The high-speed clock must operate at higher frequency than the synthesized clock because of Nyquist theorem.

The phase accumulator 92 generates the phase component of the output clock fops. It is implemented as a q-bit adder 100, with two inputs: the phase increment word $\phi = D_{DDS}$ and the previous sum. The output clock frequency can be expressed as $$f_{DDS} = \frac{\phi \cdot f_{o2}}{2^q}. \quad (3)$$

The phase accumulator 92 represents a cyclic phase generator producing a time series of binary integer values (phase sequence) corresponding to the oscillator progression of phase. The phase sequence is generated by a q-bit accumulator 102 clocked at the sample rate, $f_{DO} = f_{o2}$, which accumulates, modulo $2^q$.

Once the phase information is generated, it must be converted to a sinusoidal value. The lookup table 94 stores samples of a sinusoid. The phase accumulator 92 is used to generate a suitable phase argument that is mapped by the lookup table 94 to the desired output waveform. Thus, the second component in a DDS 90 is a memory or mapping device that performs the nonlinear transformation of $\omega t \Rightarrow \sin(\omega t)$. If an analog output is required, the DDS 90 presents the digital samples from the lookup table 94 to a DAC 96 and a low-pass filter 98 to obtain an analog waveform with the specific frequency structure. Resolution of the DAC 96 determines the quality of the output waveform. Of course, the samples are also commonly used directly in the digital domain.

As an example, if the DDS 90 is operating with a control input $\phi = D_{nom}$ which corresponds to the nominal frequency $f_{DDS} = f_{nom}$. Adding a quantity $-D_{corr}$ to $D_{nom}$ (i.e., $D_{DDS} = D_{nom} - D_{corr}$) results in a decrease in the output frequency, $f_{DDS} = f_{nom} - \Delta f$ whereas adding a quantity $+D_{corr}$ to $D_{nom}$ (i.e., $D_{DDS} = D_{nom} + D_{corr}$) results in an increase in the output frequency, $f_{DDS} = f_{nom} + \Delta f$. Thus, by appropriately controlling the quantity $D_{corr}$ added to $D_{DDS}$, the output frequency of the DDS 90 (i.e., $f_{DDS}$) may be controlled accordingly. The size of the phase increment determines the actual output frequency and the fixed binary width q of the accumulator 92 (which overflows) determines the minimum frequency resolution of the DDS 90.

Figure 19:
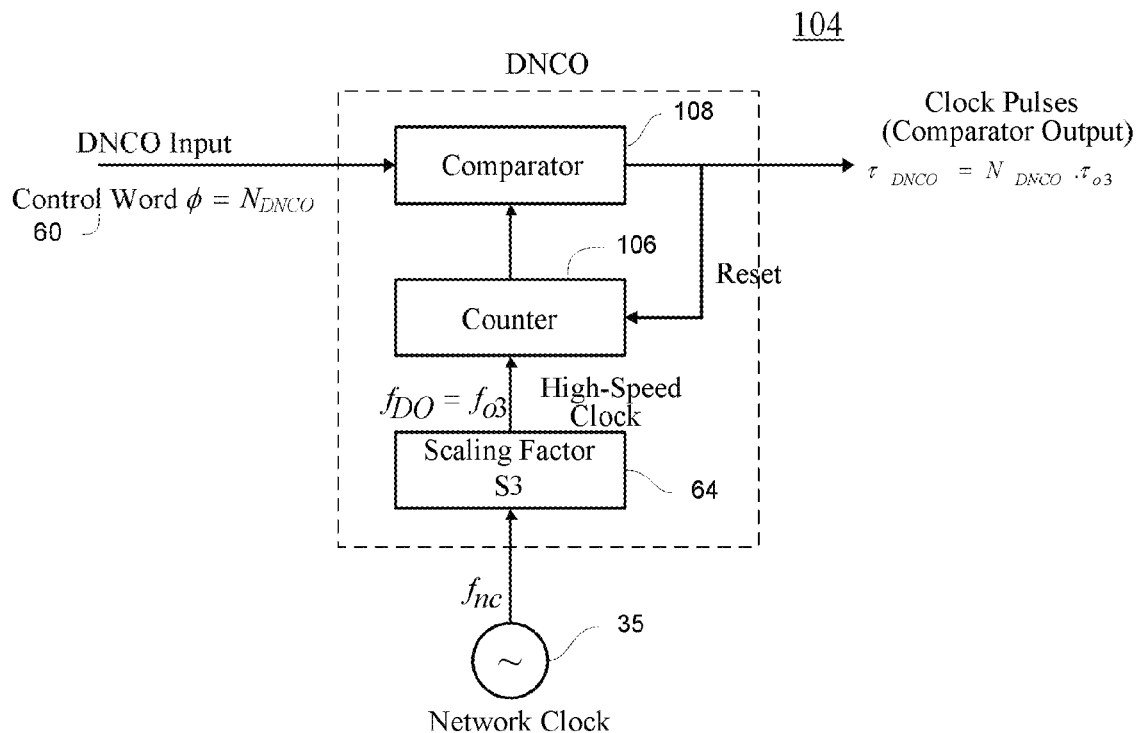
FIG. 19 is a block diagram of an exemplary Divide-by-N counter oscillator ("DNCO") constructed in accordance with the principles of the present invention.
Figure 20:
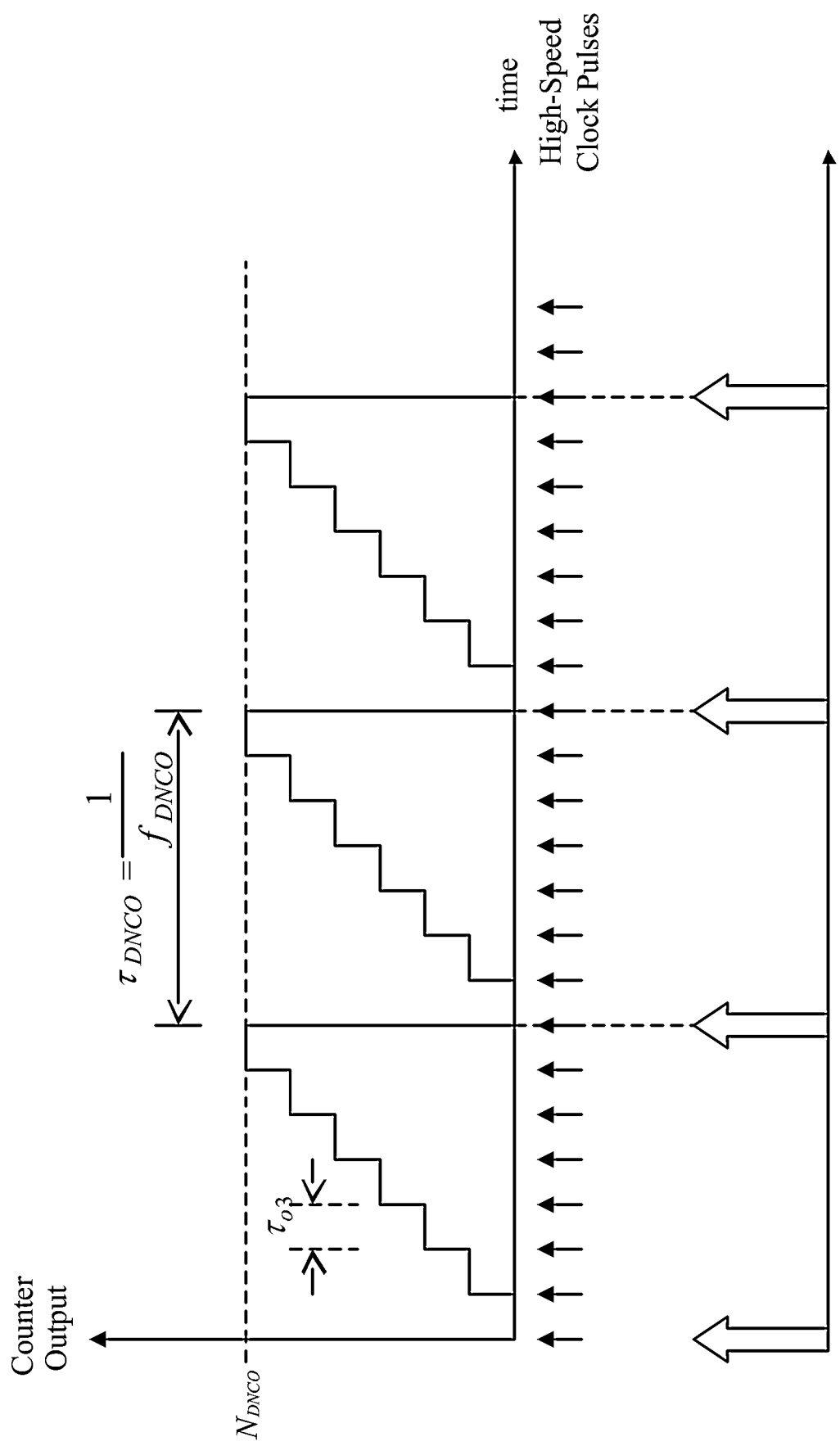
FIG. 20 is a timing diagram illustrating the operation of a DNCO in accordance with the principles of the present invention.

Referring now to FIG. 19, an exemplary functional block diagram of an alternative embodiment of a digital oscillator, a divide-by-N counter oscillator ("DNCO") 104 is provided. This DNCO 104 behaves essentially as a programmable divide-by-N counter. The output of a stable high-speed oscillator is used to drive a counter 106 which increases by one every clock cycle. The high-speed oscillator usually has a frequency, $f_{DO} = f_{o3}$, equal to $N_{nom}$ times the nominal frequency, $f_{nom} = 1/\tau_{nom}$, where $N_{nom}$ determines the number of quantization levels and the phase error resolution over $2\pi$. The comparator 108 compares the content of the counter 106 with the control input value $N_{DNCO}$ (control word 60) and when they match, outputs a pulse which serves both as the DNCO output and a reset signal for the counter 106. Thus, the period of the counter output (the time between reset pulses) is proportional to $N_{DNCO}$. By varying the control input $N_{DNCO}$, the DNCO period may be controlled. The operation of the DNCO 104 is illustrated in FIG. 20. One can readily see from FIG. 20, the convenience of generating timing pulses using the simple programmable counter 106.

Figure 21:
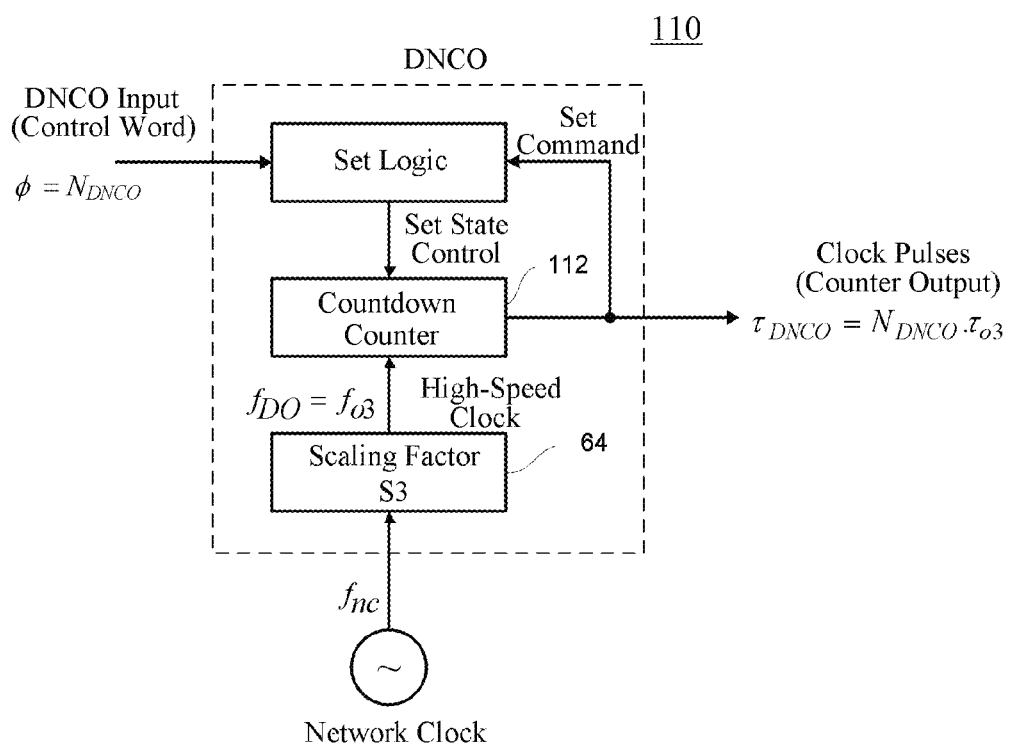
FIG. 21 is an alternative implementation of a DNCO, constructed in accordance with the principles of the present invention.

Another embodiment of a digital oscillator constructed using a DNCO 110 is provided in FIG. 21. A countdown counter 112 is preset to count $N_{DNCO}$ and counts down to zero. Upon hitting the zero state, an output clock pulse is generated and the countdown counter 112 is reset to $N_{DNCO}$ for the beginning of the next period. This approach may be more preferable than the implementation shown in FIG. 19 with the up-counter because the delay in recognizing the zero state is constant for any count.

Because a PLL is essentially a feedback control system, mathematical models of the PLL components may be used in order to determine the parameters of the loop filter. Due to the discrete nature of the DPLL, its operations are described by linear difference equations. The z-transform technique is employed to analyze the general tracking, i.e., steady-state behavior of the DPLL. Under the steady-state assumption, the phase-frequency error samples are small and the general non-linear difference equation may be approximated by a linear equation which may be solved using the z-transform technique. It is noted that when the DPLL has acquired lock and is not pulled out by large phase steps, frequency steps, or phase noise applied to its reference input, its performance can be analyzed by a linear model.

In the DDS 90, the nominal control word 60 $D_{nom}$ produces the corresponding nominal frequency $f_{nom}$. Assuming that the control input $D_{nom}$ is changed by the amount $D_{corr}$ at discrete time n. Note that change takes effect in the next discrete interval. This change results in an output frequency of $$f_{DDS}(n) = \frac{f_{o2}}{2^q}(D_{nom} + D_{corr}(n-1)) = f_{nom} + \Delta f(n), \quad (4)$$

or $$f_{DDS}(n) = f_{nom} + \frac{f_{o2}}{2^q}D_{corr}(n-1). \quad (5)$$

This corresponds to an angular frequency of $$\omega_{DDS}(n) = \omega_{nom} + \frac{2\pi f_{o2}}{2^q}D_{corr}(n-1). \quad (6)$$

The above equation may also be written as $$\omega_{DDS}(n)=\omega_{nom}+K_{DDS}D_{corr}(n-1)=\omega_{nom}+\Delta\omega(n), \quad (7)$$

where $K_{DDS}=2\pi f_{o2}/2^q$ is the DDS gain. By definition, the phase of the DDS $\theta_{DDS}$ is given by the integral over the frequency variation $\Delta\omega(n)=\omega_{DDS}(n)-\omega_{nom}$ and is given as $$\theta_{DDS}(n) = \sum_{i=0}^{n}\Delta\omega(i) = K_{DDS}\sum_{i=0}^{n}D_{corr}(i). \quad (8)$$

It is important to note that the DDS appears in the digital PLL as a digital integrator, just as the VCO appears as an analog integrator in the analog PLL. Given that $\omega_{DDS}=2\pi f_{o2}D_{DDS}/2^q$, the DDS gain can be obtained alliteratively as $K_{DDS}=d\omega_{DDS}/dD_{DDS}=2\pi f_{o2}/2^q$. From the above integration, the transfer function of the DDS in the z-domain is given as $$G_{DDS}(z) = \frac{\Theta_{DO}(z)}{\Theta_{corr}(z)} = \frac{\Theta_{DDS}(z)}{D_D(z)} = K_{DDS}\cdot\frac{z^{-1}}{1-z^{-1}} = 2^{1-q}\pi f_{o2}\cdot\frac{z^{-1}}{1-z^{-1}}, \quad (9)$$

where $z^{-1}$ denotes the delay operator (i.e., $z^{-1}x(n)=x(n-1)$, and $\Theta_{DDS}(z)$ and $D_D(z)$ are the z-transforms of $\theta_{DDS}(n)$ and $D_{corr}(n)$, respectively.

The DNCO is a programmable oscillator, implemented by loading a high-speed counter with a variable count. Denoting $\tau=1/f_{nom}$ as the nominal, or center, period of the DPLL, the clock period, $\tau_{DNCO}$, of the DNCO may be expressed in terms of the clock period $\tau_{nom}$ as follows $$\tau_{DNCO}(n)=\tau_{nom}-\Delta\tau(n-1), \quad (10)$$

where $\Delta\tau(n-1)$ is the correction or control signal in the (n-1)th sampling instant. Note that $\tau_{nom}$ is the basic clock period, in the absence of the correction signal, corresponding to a frequency of $\omega_{nom}$ rad/s. In the DPLL, the output of the loop filter is used to control the period of the DNCO. If the high-frequency oscillator of the DNCO has a period equal to $\tau_{o3}=\tau_{nom}/N_{nom}$, then the clock period of the DNCO may be expressed in terms of the clock period $\tau_{o3}$ and the correction factor is $$\tau_{DNCO}(n)=N_{nom}\tau_{o3}-\Delta\tau(n-1). \quad (11)$$

The error signal e(n) generated by the PFD 52 is processed by the loop filter 54 ($G_{lf}(z)$) to obtain the correction factor $N_{corr}(n)$. From the operation of the DNCO, depending on the sign of $N_{corr}(n)$, a number of ticks of the high-speed clock $\tau_{o3}=1/f_{o3}$ are added to or subtracted from the nominal number of ticks $N_{nom}$. Thus, the expression for the DNCO becomes $$\tau_{DNCO}(n)=N_{nom}\tau_{o3}-N_{corr}(n-1)\tau_{o3}, \quad (12)$$

where $\Delta\tau(n-1)=N_{corr}(n-1)\tau_{o3}$. Note that $\omega_{nom}=2\pi/\tau_{o3}N_{nom}$. Let t(n) be the time corresponding to the beginning of the nth DNCO cycle and $\Delta\tau(n)$ as the DNCO input in the time interval [t(n),t(n+1)]. Taking t(0) to be zero, it follows that $$t(n) = \sum_{i=1}^{n}\tau_{DNCO}(i) = n\tau_{nom}-\tau_{o3}\sum_{j=1}^{n-1}N_{corr}(j) = n\tau_{nom}-p(n), \quad (13)$$

where the time offset p(n) from the nominal time base $n\tau_{nom}$ is given by $$p(n) = \tau_{o3}\sum_{j=1}^{n-1}N_{corr}(j). \quad (14)$$

The above summation is also equivalent to the integration $$p(n)=p(n-1)+\tau_{o3}N_{corr}(n-1). \quad (15)$$

With $\omega_{nom}\tau_{nom}=2\pi$ being the nominal time or frequency base, the DNCO output phase changes in a linear manner at a rate proportional to p(n) and may be expressed as the integrator $$\omega_{nom}p(n)=\omega_{nom}p(n-1)+\omega_{nom}\tau_{o3}N_{corr}(n-1), \quad (16)$$

or $$\theta_{DNCO}(n)=\theta_{DNCO}(n-1)+\omega_{nom}\Sigma_{o3}N_{corr}(n-1), \quad (17)$$

where $\theta_{DNCO}(n)=\omega_{nom}p(n)$. This expression is also equivalent to $$\theta_{DNCO}(n) = \quad (18)$$

-continued $$\omega_{nom}\tau_{o3}\sum_{i=0}^{n} N_{corr}(i) = \frac{2\pi}{N_{nom}}\sum_{i=0}^{n} N_{corr}(i) = \frac{2\pi f_{nom}}{f_{o3}}\sum_{i=0}^{n} N_{corr}(i).$$

Equations (17) and (18) form the basic model of the DNCO. Note that the DNCO appears in the DPLL as a digital integrator, just as the VCO appears as an analog integrator in an analog PLL. Thus, the gain of the DNCO from the above model is $$K_{DNCO} = K_{DO} = \frac{2\pi}{N_{nom}}. \tag{19}$$

The transfer function in the z-domain can also be obtained from the above integrator as $$G_{DNCO}(z) = \tag{20}$$

$$\frac{\Theta_{DO}(z)}{\Theta_{corr}(z)} = \frac{\Theta_{DNCO}(z)}{N_c(z)} = \omega_{nom}\tau_{o3} \cdot \frac{z^{-1}}{1-z^{-1}} = \frac{2\pi}{N_{nom}} \cdot \frac{z^{-1}}{1-z^{-1}},$$

where $z^{-1}$ denotes the delay operator (i.e., $z^{-1}x(n)=x(n-1)$), $\Theta_{DNCO}(z)$ and $N_C(z)$ are the z-transforms of $\theta_{DNCO}(n)$ and $N_{corr}(n)$, respectively.

The PFD 52 measures the phase difference $\theta_e(n)=\theta_{sc}(n)-\theta_{DO}(n)$ between the DO clock phase $\theta_{DO}(n)$ and the service clock phase $\theta_{sc}(n)$ and develops an output e(n) that is proportional to this phase-frequency difference $\theta_e(n)$. The ranges of $\theta_e(n)$ and e(n) are $-2\pi<\theta_e(n)<2\pi$ and $-\text{Max}<e(n)<\text{Max}$, respectively. This operation can be expressed as $$e(n)=K_{PFD}\cdot\theta_e(n), \tag{21}$$

where, as shown in FIG. 14, the slope or gain $K_{PFD}=\text{Max}/2\pi$. The error signal output e(n) is passed to the loop filter 54, F(z), to be processed. The transfer function of the PFD 52 is given as $$G_{PFD}(z) = \frac{E(z)}{\Theta_e(z)} = K_{PFD} = \frac{\text{Max}}{2\pi}, \tag{22}$$

where E(z) and $\Theta_e(z)$ are the z-transforms of e(n) and $\theta_e(n)$, respectively.

The error signal e(n) from the PFD 52 is passed to a digital loop filter 54, the output of which is used to adjust the frequency $f_{DO}$ of the oscillator 50. There are many forms of filters that can be used as the loop filter 54. For example, the digital loop filter 54 may be implemented as a proportional plus integral ("PI") filter having transfer function $G_{LF}(z)$ given by $$G_{LF}(z) = \frac{\Theta_{corr}(z)}{E(z)} = K_1 + \frac{K_2}{1-z^{-1}}, \tag{23}$$

where $K_1$ and $K_2$ are the proportional and integral path gains, respectively. The loop filter being a PI filter yields a second-order PLL.

The proportional gain $K_1$ and the integral gain $K_2$ determine the filter response. The filter gains $K_1$ and $K_2$ can be adjusted dynamically on the fly, with greater gain in the startup process for fast locking (acquisition mode) and smaller gain in steady-state for better steady-state error (tracking mode).

Figure 22:
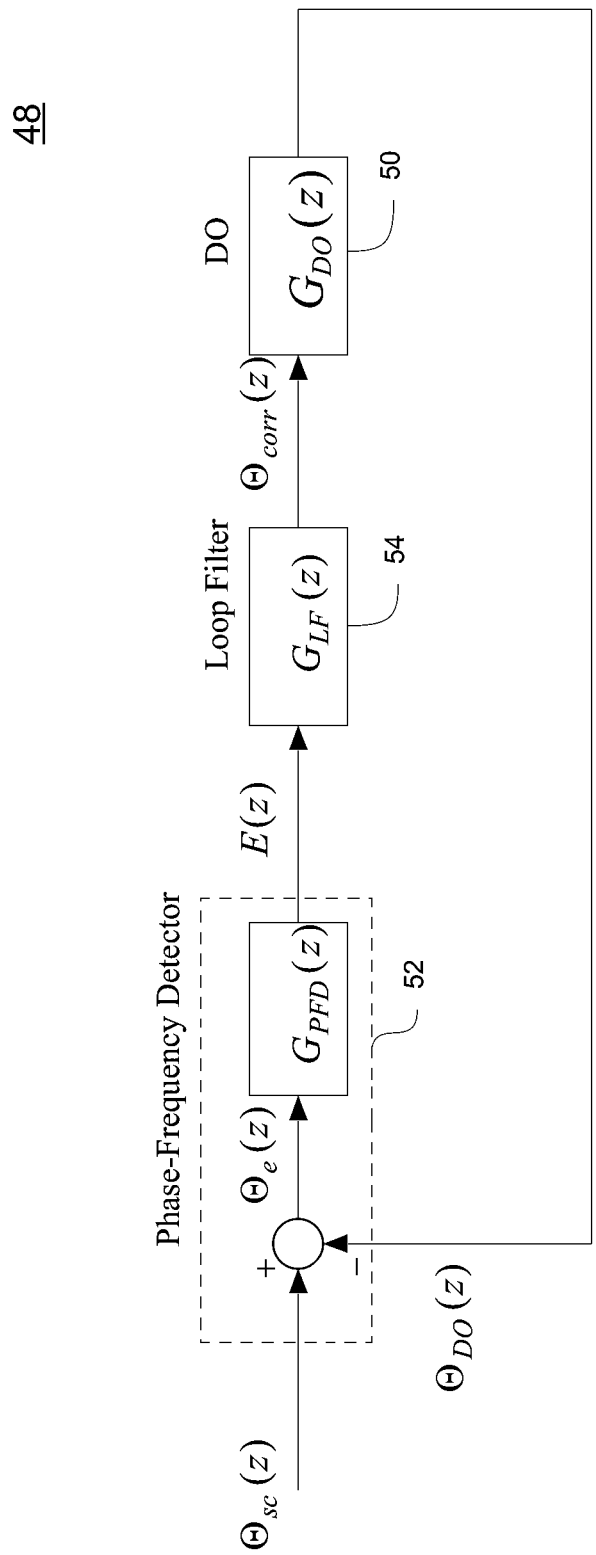
FIG. 22 is a control diagram of an exemplary digital phase locked loop constructed in accordance with the principles of the present invention.
Figure 23:
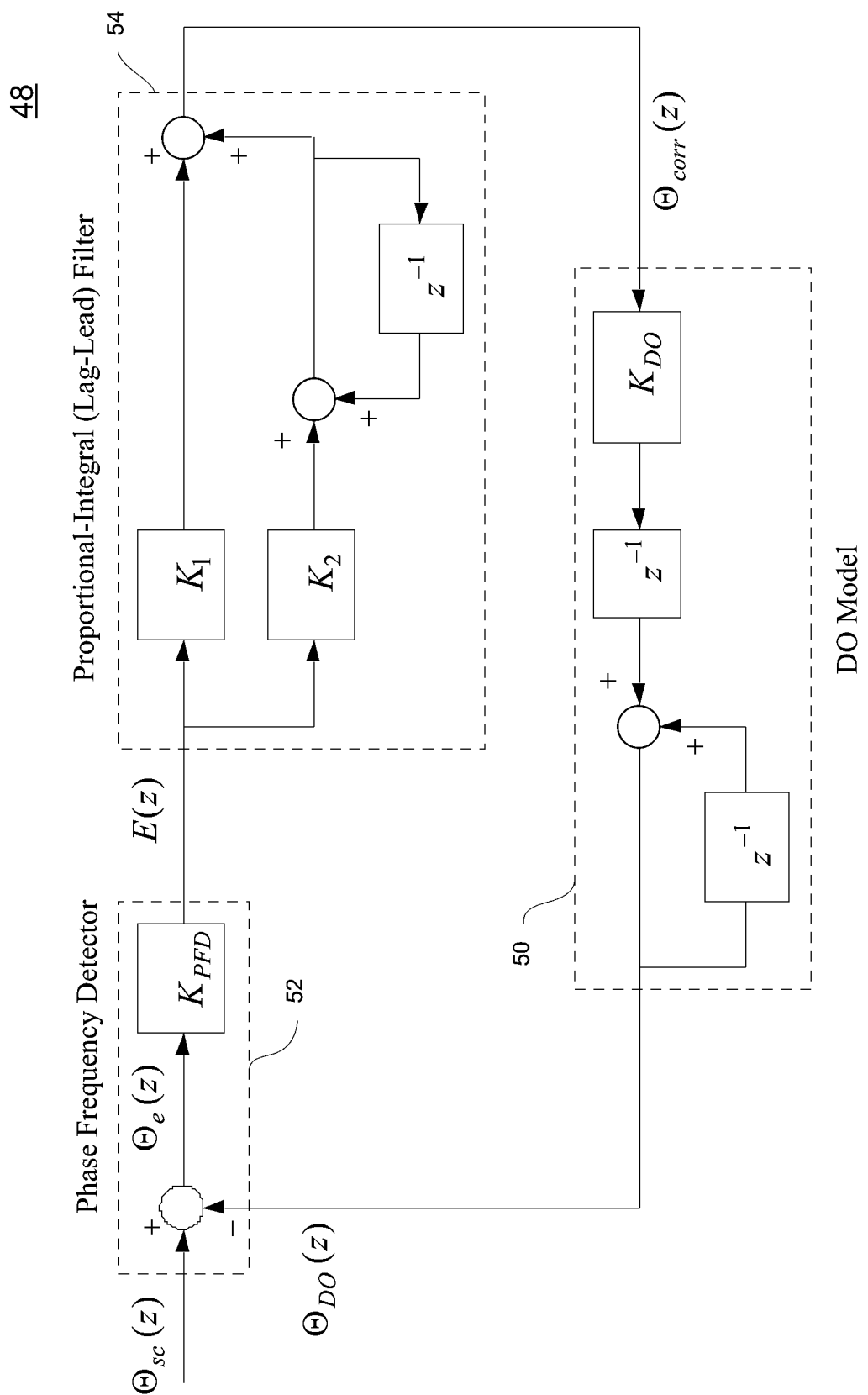
FIG. 23 is a more detailed control diagram of the exemplary digital phase locked loop of FIG. 22 constructed in accordance with the principles of the present invention.

The PLL 48, with a well-designed loop filter 54, can eventually eliminate the phase difference and make the controlled oscillator output phase and frequency lock to the reference. FIGS. 22 and 23 depict the PLL 48 as a closed-loop feedback control system. The system is a second-order feedback system due to the first-order low-pass filter.

One embodiment of the present invention includes a method for synthesizing a digital PLL 48 using control theory principles assuming that the DPLL 48 is in a tracking (steady-state) mode with small phase error about the reference phase. The design is based on the digitization of a continuous-time system whereby the s-plane poles and zeros of a specified differential equation are mapped to the z-plane poles and zeros of a corresponding difference equation using a matched pole-zero ("MPZ") method.

The analog or continuous-time PLL consists of a PFD, a loop filter and VCO. The PFD can simply be represented as a constant gain $K_{PFD}$. The VCO may be modeled as a perfect integrator in the Laplace domain as $G_{VCO}(s)=K_{VCO}/s$, where $K_{VCO}$ is its gain. The loop filter can be specified in Laplace domain as F(s). In the absence of noise, the closed-loop transfer function and normalized phase error response are specified in the Laplace domain, respectively, as $$H(s) = \frac{\Theta_{VCO}(s)}{\Theta_{sc}(s)} = \frac{K_{PFD}K_{VCO}F(s)}{s+K_{PFD}K_{VCO}F(s)}, \tag{24}$$

and $$\frac{\Theta_e(s)}{\Theta_{sc}(s)} = \frac{\Theta_{sc}(s)-\Theta_{VCO}(s)}{\Theta_{sc}(s)} = \frac{s}{s+K_{PFD}K_{VCO}F(s)} = 1-H(s), \tag{25}$$

where $\Theta_{VCO}(s)$, $\Theta_{sc}$, and $\Theta_e(s)$ are the Laplace transforms of the VCP phase $\theta_{VCO}(t)$, service clock phase $\theta_{sc}(t)$, and phase error $\theta_e(t)$, respectively.

The order of the loop is equal to the number of perfect integrators within the loop structure. Since the VCO is modeled as a perfect integrator, the loop is at least of order 1. If the loop filter contains one perfect integrator, then the loop is of order 2.

The order of the loop can be shown to greatly influence the steady-state performance of the loop. The steady-state phase error can readily be determined from equation (25) by means of the final value theorem, i.e., $$\lim_{t\to\infty}\theta_e(t) = \lim_{s\to\infty}s\Theta_e(s) = \lim_{s\to\infty}\frac{s^2\Theta_{sc}(s)}{s+K_{PFD}K_{VCO}F(s)}. \tag{26}$$

Steady-state error is defined as the deviation of the VCO phase from the reference after the transient response has died out, which is simply $\theta_e(\infty)$. It can be shown by means of equation (26) that a first-order loop or higher tracks an initial phase offset with zero steady-state error. Moreover, a second-order system is required to track a frequency step, while a third-order loop must be employed to track an accelerating phase with zero steady-state error.

Consider a second-order lag-lead filter (also known as a proportional-integral ("PI") filter) which has transfer function $$F(s) = \frac{1+s\tau_2}{s\tau_1}. \quad (27)$$

where $\tau_1$ and $\tau_2$ are time constants of the filter. The filter has a pole at s=0 and therefore behaves like an integrator. It has (at least theoretically) infinite gain at zero frequency. The closed-loop transfer function of the PLL with this filter is obtained as $$H(s) = \frac{2\zeta\omega_n s + \omega_n^2}{s^2 + 2\zeta\omega_n s + \omega_n^2} = \frac{2\zeta\omega_n s + \omega_n^2}{(s-s_0)(s-s_1)}, \quad (28)$$

where $\omega_n$ and $\zeta$ are the natural frequency and damping factors, respectively, and are specified in terms of $K_{PFD}$, $K_{VCO}$, $\tau_1$ and $\tau_2$ as $$\omega_n = \sqrt{\frac{K_{PFD} K_{VCO}}{\tau_1}}, \quad (29)$$

$$\zeta = \frac{\omega_n \tau_2}{2}. \quad (30)$$

These two parameters are used to specify performance requirements of a system. The poles of the closed loop system are $$s_{0,1} = -\zeta\omega_n \pm j\omega_n\sqrt{1-\zeta^2}. \quad (31)$$

When $\zeta>1$, the poles are real; and when $\zeta<1$, the poles are complex and conjugate. When $\zeta=1$, the poles are repeated and real and the condition is called critical damping. When $\zeta<1$, the response is underdamped and the poles are complex.

The transient response of the closed-loop system is increasingly oscillatory as the poles approach the imaginary axis when $\zeta$ approaches zero. The above model can be directly applied to the PLL in the continuous-time domain. But for systems based on sampled data, discrete-time models are used.

A linearized, time-invariant, approximate transfer function for the entire DPLL can be derived based on the conditions that nonlinearity of the system quantization is neglected. The z-domain representation of the PFD 52, loop filter 54 and the controlled oscillator 50 are given, respectively, as $$G_{PFD}(z) = K_{PFD}, \quad (32)$$

$$G_{LF}(z) = K_1 + \frac{K_2}{1-z^{-1}} = \frac{(K_1+K_2)z - K_1}{z-1}, \quad (33)$$

$$G_{DO}(z) = \frac{K_{DO} z^{-1}}{1-z^{-1}} = \frac{K_{DO}}{z-1}. \quad (34)$$

Using these transfer functions, the closed-loop transfer function of the DPLL 48 becomes $$H(z) = \frac{G_{PFD}(z) G_{LF}(z) G_{DO}(z)}{1 + G_{PFD}(z) G_{LF}(z) G_{DO}(z)}, \quad (35)$$

or $$H(z) = \frac{K_{PFD} K_{DO}(K_1+K_2)z - K_{PFD} K_{DO} K_1}{z^2 + [K_{PFD} K_{DO}(K_1+K_2) - 2]z - (K_{PFD} K_{DO} K_1 - 1)}. \quad (36)$$

The MPZ method is now applied to the H(s) to obtain a discrete-time system $H_2(Z)$ that is of form (or relates to the discrete transfer function) H(z). From this relationship, the closed form expressions for the loop filter gains $K_1$ and $K_2$ are derived. The goal here is to map the system that meets the performance requirements specified by $\omega_n$ and damping factor $\zeta$ to a corresponding model in the z-domain. The MPZ method directly maps the s-plane poles and zeros of an analog system to the corresponding z-plane poles and zeros of a discrete-time system.

An embodiment of the present invention uses a Modified-MPZ ("MMPZ") method to convert the s-plane poles and zeroes to corresponding z-plane poles and zeroes for use in a discrete-time system. First, the s-plane poles and zeros are mapped into the z-plane using the relationship, $z=e^{sT_s}$, where $T_s$ is the sampling interval. The poles of H(s) at $s=-\zeta\omega_n+j\omega_n\sqrt{1-\zeta^2}$ map to a pole of $H_2(z)$ at $$e^{T_s\left(-\zeta\omega_n + j\omega_n\sqrt{1-\zeta^2}\right)}.$$

The poles of H(s) at $s=-\zeta\omega_n - j\omega_n\sqrt{1-\zeta^2}$ will map to a pole of $H_2(z)$ at $$e^{T_s\left(-\zeta\omega_n - j\omega_n\sqrt{1-\zeta^2}\right)}.$$

The zero at $s=\omega_n/2\pi\zeta$ maps to a zero of $H_2(z)$ at $e^{-\omega_n T_s/2\zeta}$.

Second, a discrete-time transfer function is formed in z with the poles and zeroes determined above. Thus, $$H_2(z) = \frac{K_{DC}(z - e^{-\omega_n T_s/2\zeta})}{\left(z - e^{T_s\left(-\omega_n\zeta + j\omega_n\sqrt{1-\zeta^2}\right)}\right)\left(z - e^{T_s\left(-\omega_n\zeta - j\omega_n\sqrt{1-\zeta^2}\right)}\right)}, \quad (37)$$

where $K_{DC}$ is the DC or low-frequency gain of $H_2(z)$.

Third, the DC or low-frequency gain of the discrete-time system $H_2(z)$ is set equal to that of the continuous-time system H(s). The Final Value Theorem is used to find the steady state value of a time function given its Laplace transform or z-transform. For a function x(t), the theorem states, in the s-domain, that $$\lim_{t\to\infty} x(t) = \lim_{s\to 0} sX(s), \quad (38)$$

where X(s) is the Laplace transform of x(t), as long as all the poles of sX(s) are in the left half-plane ("LHP") of the s-plane. In the z-domain, the theorem states that $$\lim_{k\to\infty} x(kT_s) = \lim_{z\to 1}(1-z^{-1})X(z), \quad (39)$$

where X(z) is the z-transform of x(t) and if all the poles of $(1-z^{-1})X(z)$ are inside the unit circle. The theorem can also be use to find the DC gain of a system. The DC gain is the ratio of the output of a system to inputs (presumed constant) after all transients have decayed. To find the DC gain, it is assumed that there is a unit step input and the Final Value Theorem is used to compute the steady state value of the output. Therefore, for a system with transfer function G(s), the DC gain is defined as $$\text{DC gain} = \lim_{s \to 0} sG(s)\frac{1}{s} = \lim_{s \to 0} G(s), \quad (40)$$

and for a system with transfer function G(z), the DC gain is defined as $$\text{DC gain} = \lim_{z \to 1}(1 - z^{-1})G(z)\frac{1}{1 - z^{-1}} = \lim_{z \to 1} G(z). \quad (41)$$

The DC gain of H(s) is obtained as $$\lim_{s \to 0} H(s) = 1.$$

Setting the DC gain of $H_2(z)$ to that of H(s), it is easy to see that $K_{DC}=1$. Therefore, the transfer function $H_2(z)$ simplifies to $$H_2(z) = \frac{(z - e^{-\omega_n T_s/2\zeta})}{\left(z - e^{T_s\left(-\omega_n\zeta + j\omega_n\sqrt{1-\zeta^2}\right)}\right)\left(z - e^{T_s\left(-\omega_n\zeta - j\omega_n\sqrt{1-\zeta^2}\right)}\right)}. \quad (42)$$

The transfer function $H_2(z)$ can further be expressed as $$H_2(z) = \frac{z - e^{-\omega_n T_s/2\zeta}}{z^2 - 2e^{-\zeta\omega_n T_s}\cos(\omega_n T_s\sqrt{1-\zeta^2})z + e^{-2\zeta\omega_n T_s}}. \quad (43)$$

Comparing the denominators (or characteristic functions) of H(z) and $H_2(z)$, it is noted that $$-K_{PFD}K_{DO}K_1 + 1 = e^{-2\zeta\omega_n T_s}, \quad (44)$$

or $$K_1 = \frac{1}{K_{PFD}K_{DO}}[1 - e^{-2\zeta\omega_n T_s}], \quad (45)$$

and $$K_{PFD}K_{DO}(K_1 + K_2) - 2 = -2e^{-\zeta\omega_n T_s}\cos(\omega_n T_s\sqrt{1-\zeta^2}), \quad (46)$$

or $$K_2 = \frac{1}{K_{PFD}K_{DO}}[1 + e^{-2\zeta\omega_n T_s} - 2e^{-\zeta\omega_n T_s}\cos(\omega_n T_s\sqrt{1-\zeta^2})]. \quad (47)$$

Typically, performance specification for feedback control systems often involves certain requirements associated with the time response of the system. The setting time, $t_{set}$, is defined as the time it takes for the system transients to decay. For the PLL, is also referred to as the locking time. For the second-order system with $0 \le \zeta < 1$, the setting time (for the system to settle within 1% of the input amplitude) is given by $$t_{set} = \frac{4.6}{\zeta\omega_n}. \quad (48)$$

Thus, for a second-order system, by specifying the settling time, $t_{set}$, and the damping factor (e.g., $\zeta=0.707$), the undamped natural frequency $\omega_n$, and the filter gains $K_1$ and $K_2$ can easily be determined from the above equations.

Embodiments of the present invention advantageously provide a method for differential timing transfer over Synchronous Ethernet networks. The clock synchronization scheme includes a master DPLL with its own local DO, and a number of remote DOs placed at various locations in the packet network. In the master, error signals are generated by a PFD and then processed by a loop filter to form a DO control word. The DO control word is used, in turn, to control the local DO as well as the remote DOs. Communication between the master DPLL i.e., master clock, and the remote DOs, i.e., slave clocks, over the packet network may be done in-band (i.e., DO control words can be transmitted with or without user data) or out-of-band (i.e., using a separate physical or logical communication channel).

An exemplary method for designing the master DPLL 48 involves synthesizing a DPLL from a specification for an analog PLL. The design is based on the digitization of a continuous-time system whereby the s-plane poles and zeros of a specified system are mapped to the z-plane poles and zeros of a corresponding discrete-time system using a modified Matched Pole-Zero ("MMPZ") method.

The present invention can be realized in hardware, software, or a combination of hardware and software. Any kind of computing system, or other apparatus adapted for carrying out the methods described herein, is suited to perform the functions described herein.

A typical combination of hardware and software could be a specialized or general purpose computer system having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

In addition, unless mention was made above to the contrary, it should be noted that all of the accompanying drawings are not to scale. Significantly, this invention can be embodied in other specific forms without departing from the spirit or essential attributes thereof, and accordingly, reference should be had to the following claims, rather than to the foregoing specification, as indicating the scope of the invention.

What is claimed is:

1. A system for transferring differential timing over a packet network, the packet network having a network backplane timed by a scaled primary reference clock, the system comprising a receiving service interface communicatively coupled to the network backplane and configured to:

receive, from a transmitting service interface, a first control word, the first control word indicating an error differential between a service clock connected to the transmitting service interface and a copy of the service clock synthesized by a master digital oscillator at the transmitting service interface using the scaled primary reference clock; and use the first control word and the scaled primary reference clock at a slave digital oscillator to recreate the service clock for timing the receiving service interface.

2. The system of claim 1, wherein a nominal control word is known by the receiving service interface and the first control word comprises at least one correlation sample.

3. The system of claim 1, wherein the receiving service interface is configured to map the first control word into a second control word usable by the slave digital oscillator, the mapping being based on a difference between the master digital oscillator and the slave digital oscillator.

4. The system of claim 1, wherein the receiving service interface is configured to receive updated control words and apply the updated control words to the service clock defining the receiving service interface.

5. A method of operating a receiving service interface of a system for transferring differential timing over a packet network, the packet network having a network backplane timed by a scaled primary reference clock, the method comprising:

receiving, from a transmitting service interface, a first control word, the first control word indicating an error differential between a service clock connected to the transmitting service interface and a copy of the service clock synthesized by a master digital oscillator at the transmitting service interface using the scaled primary reference clock; and using the first control word and the scaled primary reference clock at a slave digital oscillator to recreate the service clock for timing the receiving service interface.

6. The method of claim 5, wherein a nominal control word is known by the receiving service interface and the first control word comprises at least one correlation sample.

7. The method of claim 5, further comprising mapping the first control word into a second control word usable by the slave digital oscillator, the mapping being based on a difference between the master digital oscillator and the slave digital oscillator.

8. The method of claim 5, further comprising receiving updated control words and applying the updated control words to the service clock defining the receiving service interface.

9. A method of operating a transmitting service interface of a system for transferring differential timing over a packet network, the packet network having a network backplane timed by a scaled primary reference clock, the method comprising:

receiving a service clock;

generating a first control word containing an error differential between the service clock and a synthesized copy of the service clock synthesized using the scaled primary reference clock;

inputting the first control word to a digital oscillator, the digital oscillator providing the synthesized copy of the service clock based on the first control word; and transmitting a packet containing the first control word on the network backplane toward the receiving service interface.

10. The method of claim 9, further comprising controlling a time period of the digital oscillator using at least one clock state sampling.

11. The method of claim 9, wherein the transmitting service interface comprises a digital phase-locked loop which is synthesized from a specification for an analog phase-locked loop based on the digitization of a continuous-time system to a corresponding discrete-time system using a modified pole-zero method.

12. The method of claim 11, wherein the modified pole-zero method comprises:

mapping s-plane poles and zeros of the analog phase-locked loop into z-plane poles and zeros;

forming a discrete-time transfer function using the z-plane poles and zeros; and setting a low-frequency gain of the discrete-time system substantially equal to that of the continuous-time system.

13. The method of claim 9, further comprising:

updating the first control word at a periodic interval; and transmitting a packet containing the updated control word on the network backplane toward the receiving service interface.

14. The method of claim 9, wherein the transmitting service interface comprises a digital phase-locked loop comprising a phase-frequency detector, a loop filter and a master digital oscillator.

15. The method of claim 14, wherein the master digital oscillator is one of a direct digital synthesizer and a divide-by-N counter oscillator.

16. The method of claim 15, wherein the first control word is used to control the master digital oscillator.

* * * * *